US012733369B2

(12) United States Patent
Kim et al.

(10) Patent No.: US 12,733,369 B2
(45) Date of Patent: Sep. 8, 2026

(54) DISPLAY DEVICE

(71) Applicant: LG Display Co., Ltd., Seoul (KR)

(72) Inventors: Byonghoo Kim, Paju-si (KR); Sumin Lee, Paju-si (KR); Eunsoo Chang, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 18/497,620

(22) Filed: Oct. 30, 2023

(65) Prior Publication Data

US 2024/0224700 A1 Jul. 4, 2024

(30) Foreign Application Priority Data

Dec. 30, 2022 (KR) ........................ 10-2022-0190595

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0448* (2019.05); *H10K 59/122* (2023.02);
(Continued)

(58) Field of Classification Search
CPC .... H10K 59/873; H10K 59/879; H10K 59/40; H10K 59/122; H10K 50/858;
(Continued)

(56) References Cited

U.S. PATENT DOCUMENTS

2002/0113241 A1* 8/2002 Kubota .................. H05B 33/10 257/79
2009/0268128 A1* 10/2009 Yamada ............ G02F 1/133606 349/67

(Continued)

FOREIGN PATENT DOCUMENTS

KR 10-2019-0016635 A 2/2019
KR 10-2021-0086245 A 7/2021
KR 10-2022-0087826 A 6/2022

OTHER PUBLICATIONS

Ministry of Intellectual Property of Korea, Office Action, Korean Patent Application No. 10-2022-0190595, Jul. 20, 2026, 18 pages.

*Primary Examiner* — Christopher E Leiby
(74) *Attorney, Agent, or Firm* — Fenwick & West LLP

(57) ABSTRACT

A display device is disclosed. More particularly, the display device includes a touch sensor unit on the encapsulation layer of the display panel and a lens layer on the touch sensor unit, the touch sensor unit includes a plurality of bridge electrodes on the encapsulation layer, an organic layer on the bridge electrodes to expose at least a part of each of the plurality of bridge electrodes, and a touch electrode in contact with each of the plurality of exposed bridge electrodes, and the organic layer includes a first layer including a plurality of first contact holes which exposes at least a part of each of the plurality of bridge electrodes, and a second layer on the first layer and includes a plurality of second contact holes that each overlap a corresponding one of the plurality of first contact holes.

18 Claims, 14 Drawing Sheets

(51) Int. Cl.
*H10K 59/122* (2023.01)
*H10K 59/80* (2023.01)

(52) U.S. Cl.
CPC ......... *H10K 59/873* (2023.02); *H10K 59/879* (2023.02); *G06F 2203/04111* (2013.01)

(58) Field of Classification Search
CPC ...... G06F 3/041; G06F 3/0446; G06F 3/0443; G06F 3/0412; G06F 3/0488; G06F 2203/04111
See application file for complete search history.

(56) References Cited

U.S. PATENT DOCUMENTS

| | | | | |
|---|---|---|---|---|
| 2011/0284881 | A1* | 11/2011 | Shikina | G09G 3/3233<br>257/E27.121 |
| 2013/0241857 | A1* | 9/2013 | Chung | G06F 3/041<br>216/13 |
| 2017/0364194 | A1* | 12/2017 | Jang | H10K 59/1213 |
| 2019/0051711 | A1 | 2/2019 | Lee et al. | |
| 2021/0200357 | A1 | 7/2021 | Lee et al. | |
| 2022/0190295 | A1* | 6/2022 | Son | H10K 59/40 |
| 2022/0199715 | A1 | 6/2022 | Kim et al. | |
| 2023/0292558 | A1* | 9/2023 | Bang | H10K 59/40 |
| 2023/0403909 | A1* | 12/2023 | Park | H10K 59/40 |
| 2024/0034852 | A1* | 2/2024 | Zhao | C09K 11/025 |
| 2024/0280904 | A1* | 8/2024 | Lee | G03F 7/0388 |
| 2024/0397798 | A1* | 11/2024 | Li | G06F 3/0412 |

* cited by examiner

DISPLAY DEVICE

CROSS-REFERENCE TO RELATED APPLICATION

This application claims the priority of Republic of Korea Patent Application No. 10-2022-0190595 filed on Dec. 30, 2022, in the Korean Intellectual Property Office, the disclosure of which is hereby incorporated by reference in its entirety.

BACKGROUND

Field

The present disclosure relates to a display device, and more particularly, to a display device which is capable of controlling a viewing angle with an excellent touch performance and productivity.

Description of the Related Art

An organic light emitting diode (OLED) which is a self-emitting device includes an anode, a cathode, and an organic compound layer formed therebetween. The organic compound layer is formed of a hole transport layer (HTL), an emission layer (EML), and an electron transport layer (ETL). When a driving voltage is applied to the anode and the cathode, holes which pass through the hole transport layer HTL and electrons which pass through the electron transport layer ETL move to the emission layer EML to form excitons so that the emission layer EML generates visible rays. The organic light emitting display device includes an organic light emitting diode which is a self-emitting device, unlike a liquid crystal display device including a backlight which is a separate light source and is used for various purposes with a fast response speed, high emission efficiency, high luminance, and a large viewing angle.

There is no restriction on a viewing angle of the organic light emitting display device, but recently, it is requested to limit the viewing angle for reason, such as protection of privacy and information. However, the restriction on the viewing angle varies depending on whether a passenger is driving the vehicle or whether passengers in a driver's seat and a front passenger's seat of a vehicle are watching the display device, so that it is necessary to selectively switch the viewing angle. Further, in some countries, media played in the front passenger's seat is prohibited from being exposed to the driver's seat so that it is necessary to selectively switch the viewing angle.

SUMMARY

Accordingly, an object to be achieved by the present disclosure is to provide a display device which selectively restricts a viewing angle.

Another object to be achieved by the present disclosure is to simplify a stack structure and improve the productivity by embedding a component for controlling a viewing angle in a display panel.

Still another object to be achieved by the present disclosure is to provide a display device which efficiently implements a viewing angle control structure and improves a touch performance.

Objects of the present disclosure are not limited to the above-mentioned objects, and other objects, which are not mentioned above, can be clearly understood by those skilled in the art from the following descriptions.

In one embodiment, a display device comprises: a substrate; a plurality of light emitting diodes on the substrate; an encapsulation layer on the plurality of light emitting diodes; a touch sensor unit on the encapsulation layer; and a lens layer on the touch sensor unit, wherein the touch sensor unit includes: a plurality of bridge electrodes on the encapsulation layer; an organic layer on the plurality of bridge electrodes, at least a part of each of the plurality of bridge electrodes exposed through the organic layer; and a touch electrode in contact with each of the plurality of exposed bridge electrodes, and the organic layer includes: a first layer including a plurality of first contact holes that expose at least a part of each of the plurality of bridge electrodes; and a second layer on the first layer, the second layer including a plurality of second contact holes that each overlap a corresponding one of the plurality of first contact holes.

In one embodiment, a display device comprises: a substrate; a plurality of subpixels on the substrate, the plurality of subpixels configured to emit light; an encapsulation layer on the plurality of subpixels; a bridge electrode on the encapsulation layer; an organic layer on the bridge electrode, the organic layer including a first layer on the bridge electrode, a second layer on the first layer and having an end that is inset from an end of the first layer such that the end of the first layer extends past the end of the second layer, and a hole through the first layer and the second layer; a touch electrode that is in contact with the bridge electrode through the hole in the organic layer; and a lens layer on the organic layer, the lens layer including a plurality of lenses.

In one embodiment, a display device comprises: a substrate; a subpixel on the substrate, the subpixel including a first light emitting element and a second light emitting element configured to emit light of a same color; a lens layer including a first lens and a second lens, the first lens overlapping the first light emitting element and the second lens overlapping the second light emitting element; a bridge electrode that is non-overlapping with the subpixel; an organic layer between the bridge electrode and the lens layer, the organic layer including a hole in the organic layer such than a side surface of the organic layer includes a step portion, and a touch electrode that is in contact with the bridge electrode through the hole in the organic layer, wherein during a first mode of the display device the first light emitting element is turned on to emit light through the first lens and the second light emitting element is turned off such that that the display device has a first viewing angle, and during a second mode of the display device the second light emitting element is turned on to emit light through the second lens and the first light emitting element is turned off such that the display device has a second viewing angle that is different from the first viewing angle.

Other detailed matters of the exemplary embodiments are included in the detailed description and the drawings.

According to the present disclosure, a display device in which a component for controlling a viewing angle is embedded by applying an organic layer to a touch sensor unit and applying a lens layer onto the touch sensor unit is provided.

According to the present disclosure, a thickness of an organic layer is increased to improve a viewing angle control characteristic and a luminance.

According to the present disclosure, a curability of the organic layer is improved to solve process problems such as adhesion defects, undercut defects, and surface characteristic defects.

According to the present disclosure, a double-stepped structure is applied to an end portion of the organic layer to make a gradient of the end portion of the organic layer gentle, thereby solving the problem of poor deposition of a touch electrode.

According to the present disclosure, a difference in a coefficient of thermal expansion between the organic layer and the touch electrode is reduced to improve the efficiency of the touch electrode deposition process.

According to the present disclosure, a permittivity of an organic layer is lowered to reduce the parasitic capacitance, thereby improving a touch characteristic.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
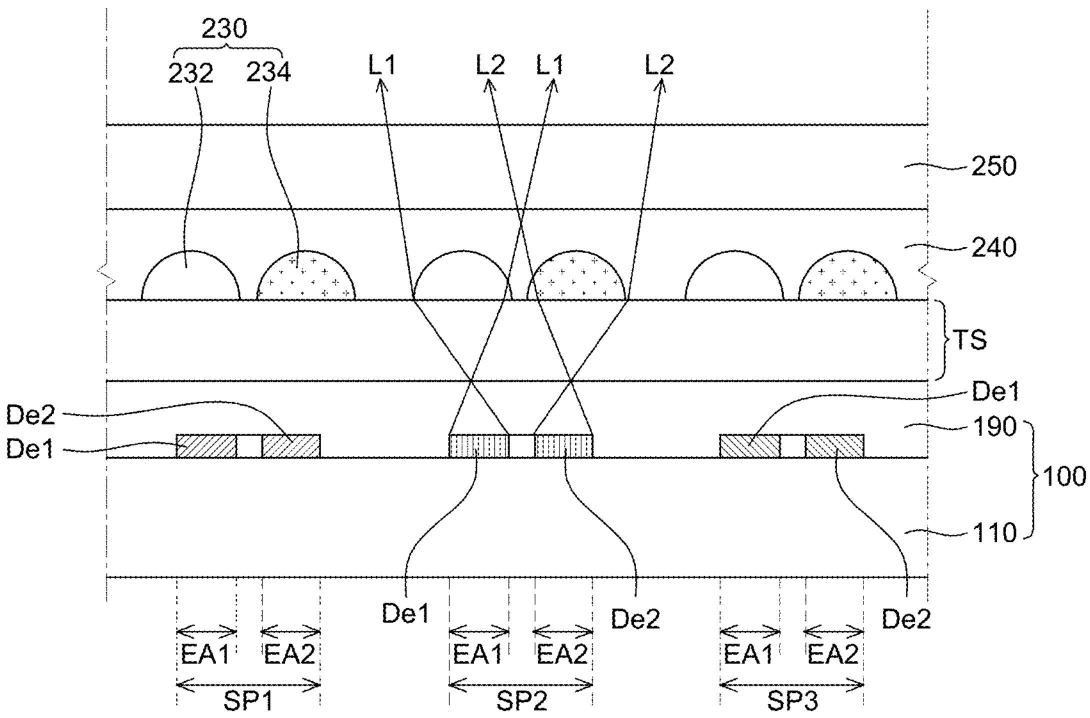
FIG. 1 is a schematic cross-sectional view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
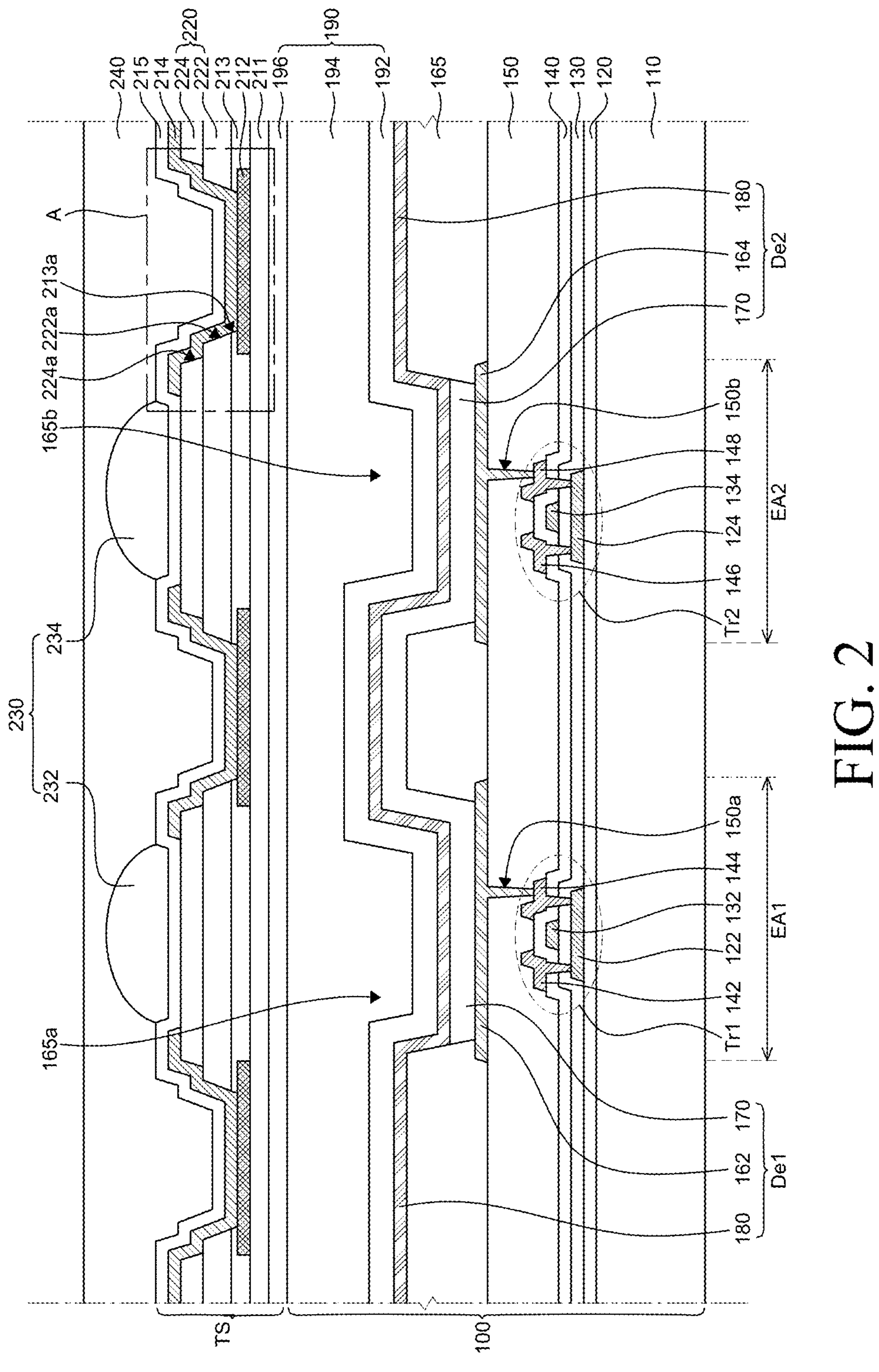
FIG. 2 is an enlarged cross-sectional view of one sub pixel of a display device according to an exemplary embodiment of the present disclosure.

FIG. 1 is a schematic cross-sectional view of a display device according to an exemplary embodiment of the present disclosure. FIG. 2 is an enlarged cross-sectional view of one sub pixel of a display device according to an exemplary embodiment of the present disclosure.

As illustrated in FIGS. 1 and 2, a display device according to an exemplary embodiment of the present disclosure includes a display panel 100, a touch sensor unit TS, a lens layer 230, and a planarization layer 240. The touch sensor unit TS includes a touch buffer layer 211, a bridge electrode 212, a touch insulating layer 213, an organic layer 220, and a touch electrode 214.

The display panel 100 includes a substrate 110, a plurality of thin film transistors Tr1 and Tr2, a plurality of light emitting diodes De1 and De2 (e.g., light emitting elements), and an encapsulation layer 190.

A plurality of sub pixels are defined on the substrate 110. For example, on the substrate 100, a first sub pixel SP1, a second sub pixel SP2, and a third sub pixel SP3 are defined. Each of the first to third sub pixels SP1, SP2, and SP3 has a first emission unit EA1 and a second emission unit EA2.

In the first emission unit EA1, a first light emitting diode De1 is provided and in a second emission unit EA2, a second light emitting diode De2 is provided.

The first sub pixel SP1, the second sub pixel SP2, and the third sub pixel SP3 may be a red sub pixel, a green sub pixel, and a blue sub pixel, respectively. Accordingly, the first light emitting diode De1 and the second light emitting diode De2 of the first sub pixel SP1 may emit red light, the first light emitting diode De1 and the second light emitting diode De2 of the second sub pixel SP2 may emit green light. Further, the first light emitting diode De1 and the second light emitting diode De2 of the third sub pixel SP3 may emit blue light.

The encapsulation layer 190 with a flat top surface is provided above the first light emitting diode De1 and the second light emitting diode De2 to protect the first light emitting diode De1 and the second light emitting diode De2 from the moisture and oxygen.

A specific configuration of the display panel 100 will be described in detail below.

The touch sensor unit TS is provided above the display panel 100, specifically, above the encapsulation layer 190 to assign a touch sensing function. As described above, the touch sensor unit TS includes a touch buffer layer 211, a bridge electrode 212, a touch insulating layer 213, an organic layer 220, a touch electrode 214, and a touch protection layer 215.

The touch electrode 214 is an electrode which senses a touch input and may be configured by a plurality of sensing electrodes and a plurality of driving electrodes and detect a touch coordinate by sensing a change of the capacitance therebetween.

The display device according to the exemplary embodiment of the present disclosure is formed with a structure in which the bridge electrode 212 and the touch electrode 214 are directly disposed on the encapsulation layer 190 without having a separate base material and an adhesive member, rather than a structure in which a touch panel with electrodes such as a bridge electrode and a touch electrode, formed on a separate base material is disposed on the display panel by means of an adhesive member.

The organic layer 220 is provided in the touch sensor unit TS. The organic layer 220 ensures a distance between the first light emitting diode De1 and the second light emitting diode De2 and lenses 232 and 234 of the lens layer 230 to refract light from the first light emitting diode De1 and the second light emitting diode De2 by the lenses 232 and 234 to a specific direction to improve the efficiency of the lenses 232 and 234.

A specific configuration of the touch sensor unit TS will be described in detail below.

The lens layer 230 is provided above the organic layer 220. The lens layer 230 includes a first lens 232 and a second lens 234. The first lens 232 is disposed in the first emission unit EA1 to refract light from the first light emitting diode De1 to a specific direction. The second lens 234 is disposed in the second emission unit EA2 to refract light from the second light emitting diode De2 to a specific direction.

The first lens 232 is a half-spherical lens and the second lens 234 is a half-cylindrical lens. Therefore, first light L1 emitted from the first light emitting diode De1 of each sub pixel SP1, SP2, and SP3 is refracted at a specific angle by the first lens 232 to be output. Second light L2 emitted from the second light emitting diode De2 of each sub pixel SP1, SP2, and SP3 is refracted at a specific angle by the second lens 234 to be output. Accordingly, the viewing angle of each of the sub pixels SP1, SP2, and SP3 may be limited.

The first lens 232 and the second lens 234 have different viewing angle restricting directions and are selectively driven to implement a wide viewing angle and a narrow viewing angle, this will be described in detail below. That is the first lens 232 emits light with a first viewing angle and the second lens 234 emits light with a second viewing angle.

The planarization layer 240 is provided above the lens layer 230 to protect the first lens 232 and the second lens 234. The planarization layer 240 is formed of an organic insulating material and has a flat top surface. A refractive index of the planarization layer 240 is less than refractive indexes of the first lens 232 and the second lens 234.

For example, the planarization layer 240 is formed of photo acryl, benzocyclobutene (BCB), polyimide (PI), or polyamide (PA), but is not limited thereto.

Even though it is not illustrated in the drawing, at least one or more of optical functional layers, such as a polarization layer may be disposed above the planarization layer 240. The polarization layer serves to convert a polarized state of external light which is incident onto the display panel 100 to suppress the external light from being reflected from the display panel 100 and then discharged to the outside.

The display panel 100 and the touch sensor unit TS of the display device according to the exemplary embodiment of the present disclosure will be described with reference to FIGS. 2 and 3.

As illustrated in FIG. 2, a display panel 100 of a display device according to the exemplary embodiment of the present disclosure includes the substrate 110, the plurality of thin film transistors Tr1 and Tr2, the plurality of light emitting diodes De1 and De2, and the encapsulation layer 190.

Specifically, each sub pixel SP1, SP2, and SP3 on the substrate 110 includes the first emission unit EA1 and the second emission unit EA2. The substrate 110 may be a glass substrate or a plastic substrate. For example, as the plastic substrate, polyimide (PI) may be used, but is not limited thereto.

A substrate buffer layer 120 is disposed on the substrate 110. The substrate buffer layer 120 is substantially formed on the entire surface of the substrate 110. The substrate buffer layer 120 blocks the moisture or foreign materials from being introduced into the thin film transistors Tr1 and Tr2 from the substrate 110.

For example, the substrate buffer layer 120 may be formed of an inorganic material, such as silicon oxide $SiO_2$ or silicon nitride SiNx, and may be formed of a single layer or multiple layers.

A first semiconductor layer 122 and a second semiconductor layer 124 which are patterned are respectively formed in the first emission unit EA1 and the second emission unit EA2 above the substrate buffer layer 120. The first semiconductor layer 122 and the second semiconductor layer 124 may be independently formed of an oxide semiconductor material, amorphous silicon, or polycrystalline silicon, respectively.

When the first semiconductor layer 122 and the second semiconductor layer 124 are formed of an oxide semiconductor material, a shield pattern may be further formed there below. The shield pattern blocks light incident onto the first semiconductor layer 122 and the second semiconductor layer 124 to suppress the degradation of the first semiconductor layer 122 and the second semiconductor layer 124 due to the light.

When the first semiconductor layer 122 and the second semiconductor layer 124 are formed of polycrystalline silicon, impurities may be doped on both edges of each of the first semiconductor layer 122 and the second semiconductor layer 124.

A gate insulating layer 130 which is formed of an insulating material is disposed above the first semiconductor layer 122 and the second semiconductor layer 124. The gate insulating layer 130 may be formed of an inorganic insulating material such as silicon oxide $SiO_2$ or silicon nitride SiNx.

A first gate electrode 132 and a second gate electrode 134 which are formed of a conductive material, such as metal, are formed above the gate insulating layer 130 so as to correspond to the first semiconductor layer 122 and the second semiconductor layer 124, respectively.

In FIG. 2, even though it is illustrated that the gate insulating layer 130 is substantially formed on the entire surface of the substrate 110, the gate insulating layer 130 may be patterned with the same shape as the first gate electrode 132 and the second gate electrode 134, as another example.

An interlayer insulating layer 140 which is formed of an insulating material is substantially formed on the entire surface of the substrate 110, above the first gate electrode 132 and the second gate electrode 134. The interlayer insulating layer 140 may be formed of an inorganic insulating material such as silicon oxide $SiO_2$ or silicon nitride SiNx or an organic insulating material such as photo acryl or benzocyclobutene.

The interlayer insulating layer 140 has a contact hole which exposes both top surfaces of each of the first semiconductor layer 122 and the second semiconductor layer 124. The contact hole may be also formed in the gate insulating layer 130. A first source electrode 142 and a first drain electrode 144 and a second source electrode 146 and a second drain electrode 148 are formed of a conductive material, such as metal, in the first emission unit EA1 and the second emission unit EA2 above the interlayer insulating layer 140.

The first source electrode 142 and the first drain electrode 144 are in contact with both sides of the first semiconductor layer 122 through a contact hole of the interlayer insulating layer 140 and the gate insulating layer 130. The second source electrode 146 and the second drain electrode 148 are in contact with both sides of the second semiconductor layer 124 through the contact hole of the interlayer insulating layer 140 and the gate insulting layer 130.

The first semiconductor layer 122, the first gate electrode 132, the first source electrode 142, and the first drain electrode 144 form the first thin film transistor Tr1. The second semiconductor layer 124, the second gate electrode 134, the second source electrode 146, and the second drain electrode 148 form the second thin film transistor Tr2.

One or more thin film transistors having the same structure as the first thin film transistor Tr1 and the second thin film transistor Tr2 may be further formed on the substrate 110 of each sub pixel SP1, SP2, and SP3, but are not limited thereto.

A passivation layer 150 is substantially formed on the entire surface of the substrate 110, above the first source electrode 142, the first drain electrode 144, the second source electrode 146, and the second drain electrode 148. The passivation layer 150 may be formed of an organic insulating material, such as photo acryl, benzocyclobutene. Such a passivation layer 150 has a flat top surface.

In the meantime, an insulating layer which is formed of an inorganic insulating material, such as silicon oxide $SiO_2$ or silicon nitride SiNx, may be further formed below the passivation layer 150, that is, between the first thin film transistor Tr1 and the second thin film transistor Tr2 and the passivation layer 150.

The passivation layer 150 has a first drain contact hole 150*a* and a second drain contact hole 150*b* which expose the first drain electrode 144 and the second drain electrode 148, respectively.

A first anode electrode 162 and a second anode electrode 164 are formed above the passivation layer 150 with a conductive material having a relatively high work function. The first anode electrode 162 is located in the first emission unit EA1 and is in contact with the first drain electrode 144 through the first drain contact hole 150*a*. The second anode electrode 164 is located in the second emission unit EA2 and is in contact with the second drain electrode 148 through the second drain contact hole 150*b*.

For example, each of the first anode electrode 162 and the second anode electrode 164 may be formed of a transparent conductive material, such as indium tin oxide (ITO) or indium zinc oxide (IZO), but is not limited thereto.

In the meantime, the display panel 100 according to the exemplary embodiment of the present disclosure may be a top emission type in which light of the plurality of light emitting diodes De1 and De2 is output in an opposite direction to the substrate 110. Accordingly, each of the first anode electrode 162 and the second anode electrode 164 may further include a reflective electrode or a reflective layer which is formed of a metal material having a high reflectance below the transparent conductive material. For example, the reflective electrode or the reflective layer may be formed of an aluminum-palladium-copper (APC) alloy, silver (Ag), or aluminum (Al). At this time, each of the first anode electrode 162 and the second anode electrode 164 has a triple-layered structure of ITO/APC/ITO, ITO/Ag/ITO or ITO/Al/ITO, but is not limited thereto.

A bank 165 is formed of an insulating material above the first anode electrode 162 and the second anode electrode 164. The bank 165 overlaps edges of the first anode electrode 162 and the second anode electrode 164 and covers the edges of the first anode electrode 162 and the second anode electrode 164. The bank 165 has a first opening 165*a* and a second opening 165*b* which respectively expose the first anode electrode 162 and the second anode electrode 164.

In the present disclosure, the bank 165 has a single-layered structure, but may also have a double-layered structure. For example, the bank 165 may have a double-layered structure including a lower hydrophilic bank and an upper hydrophobic bank.

The emission layer 170 is formed above the first anode electrode 162 and the second anode electrode 164 which are exposed by the first opening 165*a* and the second opening 165*b* of the bank 165. The emission layer 170 above the first anode electrode 162 and the emission layer 170 above the second anode electrode 164 are connected to be integrally formed. However, the present disclosure is not limited thereto and the emission layer 170 above the first anode electrode 162 and the emission layer 170 above the second anode electrode 164 may be separated from each other.

The emission layer 170 may include a first charge auxiliary layer, a light emitting material layer, and a second charge auxiliary layer which are sequentially located from an upper portion of the first anode electrode 162 and the second anode 164. The light emitting material layer may be formed by any one of red, green, and blue light emitting materials, but is not limited thereto. However, the light emitting material may be an organic light emitting material such as a phosphorescent compound or a fluorescent compound. However, the present disclosure is not limited thereto and an inorganic light emitting material, such as a quantum dot may also be used.

The first charge auxiliary layer may include at least one of a hole injection layer HIL and a hole transport layer HTL. The second charge auxiliary layer may include at least one of an electron injection layer EIL and an electron transport layer ETL.

The cathode electrode 180 which is formed of a conductive material having a relatively low work function may be formed on the entire surface of the substrate 110, above the emission layer 170. Here, the cathode electrode 180 may be formed of aluminum or magnesium, silver, or an alloy thereof. At this time, the cathode electrode 180 has a small thickness so that the light from the emission layer 170 is transmissible therethrough.

In contrast, the cathode electrode 180 may be formed of a transparent conductive material, such as indium gallium oxide (IGO), but is not limited thereto.

The display panel 100 according to the exemplary embodiment of the present disclosure may be a top emission type in which light from the emission layers 170 of the first light emitting diode De1 and the second light emitting diode De2 is output in an opposite direction to the substrate 110, that is, is output to the outside through the cathode electrode 180. According to the top emission type, as compared with the bottom emission type with the same area, a large emission area is provided so that a luminance may be improved and the power consumption may be reduced.

An encapsulation layer 190 is substantially formed on the entire surface of the substrate 110, above the cathode electrode 180. The encapsulation layer 190 suppresses the moisture or oxygen from being introduced into the first light emitting diode De1 and the second light emitting diode De2 from the outside. The encapsulation layer 190 may be formed as a single layer or a plurality of layers. For example, the encapsulation layer 190 may have a laminated structure of a first inorganic layer 192, an organic layer 194, and a second inorganic layer 196. Here, the organic layer 194 may a layer which covers a foreign material which is generated during the manufacturing process.

The touch sensor unit TS is provided above the encapsulation layer 190 and as described above, the touch sensor unit TS includes the touch buffer layer 211, the bridge electrode 212, the touch insulating layer 213, the organic layer 220, the touch electrode 214, and the touch protection layer 215.

The touch buffer layer 211 is substantially formed on the entire surface of the substrate 110 above the encapsulation layer 190. The touch buffer layer 211 protects the light emitting diodes De1 and De2 from being damaged by suppressing the permeation of chemicals or foreign materials, such as a developer or an etchant used in the manufacturing process of the electrodes of the touch sensor unit TS.

For example, the touch buffer layer 211 may be formed of an inorganic material, such as silicon oxide $SiO_2$ or silicon nitride SiNx, and may be formed of a single layer or multiple layers.

A plurality of bridge electrodes 212 are formed on the touch buffer layer 211. The bridge electrode 212 is formed so as to correspond to at least a part between adjacent first to third sub pixels SP1, SP2, and SP3 or formed between the first emission unit EA1 and the second emission unit EA2.

The bridge electrode 212 electrically connects at least some of the plurality of touch electrodes 214 formed on the touch insulating layer 213 which is formed of an insulating material. As described above, the plurality of touch electrodes 214 includes a plurality of sensing electrodes and a plurality of driving electrodes. The plurality of sensing electrodes and the plurality of driving electrodes are disposed on the same plane and the bridge electrode 212 is disposed on a layer different from that of the plurality of touch electrodes 214 to electrically connect adjacent sensing electrodes or adjacent driving electrodes in an intersecting area of the sensing electrode and the driving electrode. Accordingly, the bridge electrode 212 suppresses the short-circuit of the sensing electrode and the driving electrode in the intersecting area thereof.

The bridge electrode 212 may be formed of a metal selected from the group consisting of molybdenum (Mo), aluminum (Al), chrome (Cr), gold (Au), titanium (Ti), nickel (Ni), copper (Cu), neodymium (Nd), tungsten (W), and an alloy thereof, but is not limited thereto. The bridge electrode 212 may be formed as a single layer or a multi-layered structure.

The touch insulating layer 213 may be formed on the bridge electrode 212. The touch insulating layer 213 is substantially formed on the entire surface of the substrate 110. The touch insulating layer 213 insulates the bridge electrode 212 and the sensing electrode or the driving electrode, among the plurality of touch electrodes 214, and is disposed between the bridge electrodes 212 to insulate adjacent bridge electrodes 212 from each other. The organic layer 220 disposed on the touch insulating layer 213 is formed of an insulating material so that the touch insulating layer 213 may be optionally omitted as needed.

The touch insulating layer 213 includes a contact hole 213*a* to electrically connect the bridge electrode 212 and a part of the touch electrode 214 to each other. The touch insulating layer 213 overlaps an edge of the bridge electrode 212 and is formed to cover the edge of the bridge electrode 212. The contact hole 213*a* exposes a top surface of the bridge electrode 212 and the bridge electrode 212 is in contact with the touch electrode 214 through the contact hole 213*a*.

The touch insulating layer 213 may be formed of an inorganic material, such as silicon oxide $SiO_2$ or silicon nitride SiNx. The touch insulating layer 213 may be formed as a single layer or a plurality of layers.

The organic layer 220 is formed above the touch insulating layer 213. As described above, the organic layer 220 ensures a distance between the first light emitting diode De1 and the second light emitting diode De2 and lenses 232 and 234 of the lens layer 230 to refract light from the first light emitting diode De1 and the second light emitting diode De2 by the lenses 232 and 234 to a specific direction to improve the efficiency of the lenses 232 and 234.

In the display device according to the exemplary embodiment of the present disclosure, the organic layer 220 includes a first layer 222 and a second layer 224.

The first layer 222 is formed above the touch insulating layer 213. The first layer 222 includes a first contact hole 222*a* which exposes a top surface of each of the plurality of bridge electrodes 212. That is, the first layer 222 is formed to overlap the edge of each of the plurality of bridge electrodes 212 above the touch insulating layer 213 and the first contact hole 222*a* overlaps the contact hole 213*a* of the touch insulating layer 213. Therefore, the contact hole 213*a* of the touch insulating layer 213 and the first contact hole 222*a* collectively expose the top surface of the bridge electrode 212 and the exposed top surface of the bridge electrode 212 is in contact with the touch electrode 214.

The second layer 224 is formed above the first layer 222 such that the first layer 222 is between the second layer 224 and the touch insulating layer 213. The second layer 224 includes a second contact hole 224a which exposes a top surface of each of the plurality of bridge electrodes 212. That is, the second layer 224 is formed above the first layer 222 so as to overlap the edge of each of the plurality of bridge electrodes 212 and the second contact hole 224a overlaps the contact hole 213a of the touch insulating layer 213 and the first contact hole 222a of the first layer 222. Therefore, the contact hole 213a of the touch insulating layer 213, the first contact hole 222a of the first layer, and the second contact hole 224a of the second layer 224 collectively expose the top surface of the bridge electrode 212 and the exposed top surface of the bridge electrode 212 is in contact with the touch electrode 214.

A specific configuration of the first layer 222 and the second layer 224 of the organic layer 220 will be described in detail below.

The touch electrode 214 is disposed so as to cover the top surface of the bridge electrode 212 exposed by the contact hole 213a of the touch insulating layer 213, the first contact hole 222a, and the second contact hole 224a which are formed to overlap each other and at least a part of the organic layer 220. The touch electrode 214 is in contact with the top surface of the bridge electrode 212 which is exposed by the contact hole 213a of the touch insulating layer 213, the first contact hole 222a of the first layer 222, and the second contact hole 224a of the second layer 224. Further, the touch electrode 214 is disposed so as to cover the end portion of the organic layer 220 exposed by the first and second contact holes 222a and 224a and the edge above the organic layer 220.

The touch electrode 214 is formed correspondingly between the adjacent first to third sub pixels SP1, SP2, and SP3 or formed correspondingly between the first emission unit EA1 and the second emission unit EA2 so as not to affect the light emission efficiency of the first emission unit EA1 and the second emission unit EA2. That is, the touch electrode 214 is not disposed above the organic layer 220 corresponding to the first emission unit EA1 and the second emission unit EA2. That is, the touch electrode 214 is non-overlapping with portions of the organic layer 220 that respectively overlap the first emission unit EA1 and the second emission unit EA2. In this case, the reduction of the light emission efficiency of the first emission unit EA1 and the second emission unit EA2 may be reduced.

The touch electrode 214 may be formed of a metal selected from the group consisting of molybdenum (Mo), aluminum (Al), chrome (Cr), gold (Au), titanium (Ti), nickel (Ni), copper (Cu), neodymium (Nd), tungsten (W), and an alloy thereof, but is not limited thereto. The touch electrode 214 may be formed as a single layer or a multi-layered structure.

A touch protection layer 215 is formed above the touch electrode 214 and above the organic layer 220. The touch protection layer 215 is substantially formed on the entire surface of the substrate 110. The touch protection layer 215 protects the touch electrode 214 from external material or foreign material, such as moisture or oxygen. The touch protection layer 215 protects the touch electrode 214 from a chemical such as an etchant, during the process of forming the lens layer 230.

The touch protection layer 215 may be formed of an inorganic insulating material or an organic insulating material and may be formed by alternately disposing a layer formed of an inorganic insulating material and a layer formed of an organic insulating material.

For example, the touch protection layer 215 may be formed of an inorganic insulating layer, such as silicon nitride SiNx, silicon oxide SiOx, aluminum oxide AlOx, silicon oxy nitride (SiON), or an organic insulating material, such as acrylic resin, polyester resin, epoxy resin, or silicon resin, but is not limited thereto. The touch protection layer 215 may be formed as a single layer or a plurality of layers.

The lens layer 230 is provided above the touch protection layer 215. As described above, the lens layer 230 includes a first lens 232 disposed in the first emission unit EA1 and a second lens 234 disposed in the second emission unit EA2. The first lens 232 and the second lens 234 have different viewing angle restricting directions and are selectively driven to implement a wide viewing angle and a narrow viewing angle.

Hereinafter, an operation of selectively implementing a first mode which is a wide field of view mode and a second mode which is a narrow field of view mode will be described in detail with reference to FIGS. 3 to 5.

Figure 3:
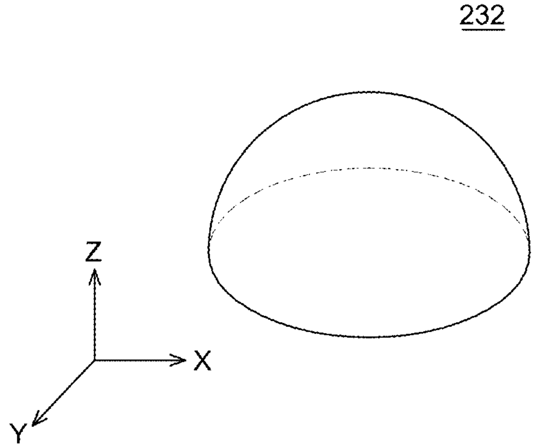
FIG. 3 is a view schematically illustrating a first lens of a display device according to an exemplary embodiment of the present disclosure.

FIG. 3 is a view schematically illustrating a first lens of a display device according to an exemplary embodiment of the present disclosure. FIG. 4 is a view schematically illustrating a second lens of a display device according to an exemplary embodiment of the present disclosure.

As illustrated in FIG. 3, the first lens 232 is a half-spherical lens and has a half-circular cross-section (e.g., a first shape) in the X-direction and the Y-direction. Accordingly, the first lens 232 restricts the viewing angle of the X-direction and the Y-direction.

For example, the first emission unit EA including the half-spherical first lens 232 has a narrow viewing angle which is 30 degrees or less in up, down, left, and right directions.

Figure 4:
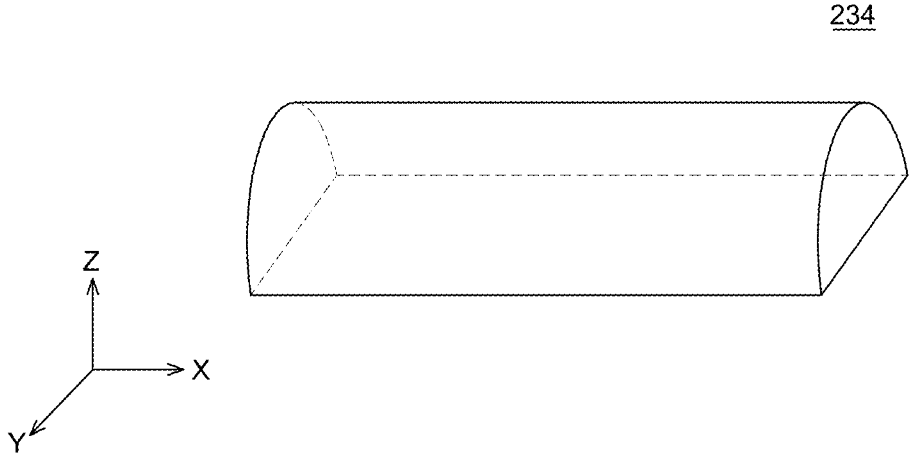
FIG. 4 is a view schematically illustrating a second lens of a display device according to an exemplary embodiment of the present disclosure.

In contrast, as illustrated in FIG. 4, the second lens 234 is a half-cylindrical lens and has a rectangle cross-section (e.g., a second shape) in the X-direction and a half-circular cross-section in the Y-direction (e.g., the first shape). Accordingly, the second lens 234 restricts the viewing angle in the Y-direction and does not restrict the viewing angle of the length direction of the second lens 234, that is, the X-direction.

For example, the second emission unit EA2 including the half-cylindrical second lens 234 has a narrow viewing angle which is 30 degrees or less in the vertical direction and has a wide viewing angle which is 60 degrees or greater in the horizontal direction.

Accordingly, the vertical narrow field of view mode and the horizontal narrow field of view mode (e.g., a first mode) are implemented by driving the first emission unit EA1 but not the second emission unit EA2 and the vertical narrow field of view mode and the horizontal wide field of view mode (e.g., a second mode) are implemented by driving the second emission unit EA2 but not the first emission unit EA1.

That is, the light emitting display device according to an exemplary embodiment of the present disclosure always has a narrow viewing angle in the vertical direction by the first and second lenses 232 and 234 and may selectively implement the wide field of view mode and the narrow field of view mode in the horizontal direction.

The horizontal wide field of view mode and narrow field of view mode will be described with reference to FIG. 5.

Figure 5:
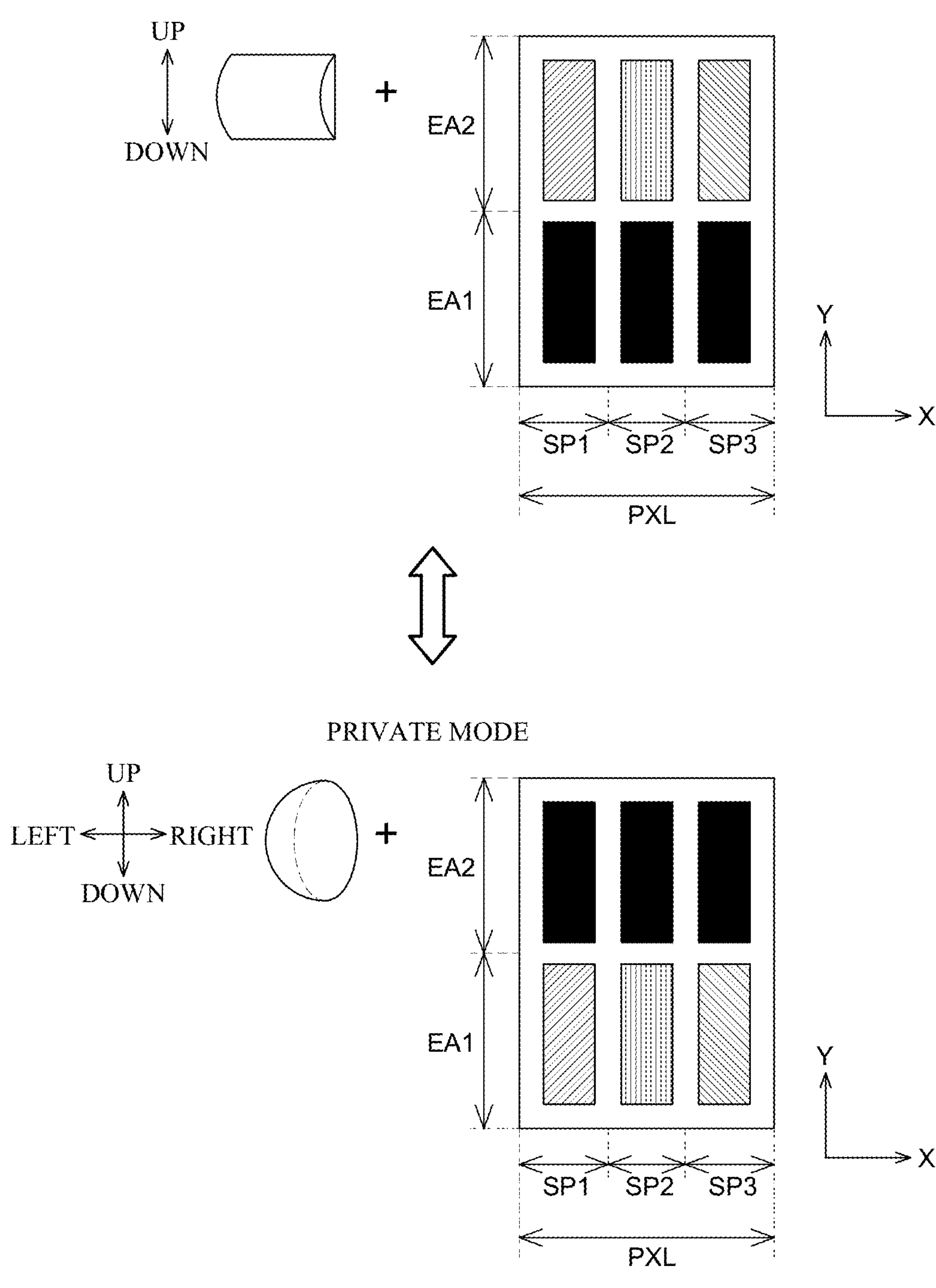
FIG. 5 is a view schematically illustrating an operation in a wide field of view mode and a narrow field of view mode of a display device according to an exemplary embodiment of the present disclosure.

FIG. 5 is a view schematically illustrating an operation in a wide field of view mode and a narrow field of view mode of a display device according to an exemplary embodiment of the present disclosure.

As illustrated in FIG. 5, one pixel PXL of a display device according to an exemplary embodiment of the present disclosure includes first to third sub pixels SP1, SP2, and SP3. Each of the first, second, and third sub pixels SP1, SP2, and SP3 has a first emission unit EA1 and a second emission unit EA2.

A half-spherical first lens 232 is provided so as to correspond to the first emission unit EA1 and a half-cylindrical second lens 234 is provided so as to correspond to the second emission unit EA2.

During the operation in the wide field of view mode (e.g., the share mode), the first light emitting diode De1 of the first emission unit EA1 is in an off-state and the second light emitting diode De2 of the second emission unit EA2 is in an on-state. Light emitted from the second light emitting diode De2 is output with a restricted viewing angle in the Y direction, that is, in the vertical direction, by the second lens 234, and is output without limiting the viewing angle, in the X-direction, that is, in the horizontal direction.

In contrast, during the operation in the narrow field of view mode (e.g., private mode), the first light emitting diode De1 of the first emission unit EA1 is in an on-state and the second light emitting diode De2 of the second emission unit EA2 is in an off-state. Light emitted from the first light emitting diode De1 is output with a restricted viewing angle in the vertical direction and in the horizontal direction by the first lens 232.

As described above, the display device according to the exemplary embodiment of the present disclosure always has a narrow viewing angle in the vertical direction so that when it is applied to the vehicle, the image is suppressed from being reflected from the windshield to obstruct the driver's view.

Further, an image having a wide viewing angle in the horizontal direction is displayed in the wide field of view mode and an image having a narrow viewing angle in the horizontal direction is displayed in the narrow field of view mode. In this case, in the wide field of view mode, both users in the driver's seat and a front passenger's seat watch the images and in the narrow field of view mode, one of the users in the driver's seat and a front passenger's seat watches the image. Accordingly, the wide field of view mode and the narrow field of view mode may be selectively implemented in the horizontal direction.

In the meantime, the first lens 232 and the second lens 234 are applied to increase a luminance as compared with the same area by the light collection effect so that the display device of the present disclosure may lower the driving voltage. Accordingly, the first emission unit EA1 and the second emission unit EA2 may be driven with a lowered driving voltage to lower the power consumption and reduce the luminance and heat generation, thereby improving the lifespan of the plurality of light emitting diodes De1 and De2.

In the meantime, as described above, the display device according to the exemplary embodiment of the present disclosure includes an organic layer 220 in the touch sensor unit TS. Further, the organic layer 220 needs to be formed with a predetermined thickness or larger to ensure a sufficient optical distance.

However, when the thick organic layer is provided in the touch sensor unit TS to ensure the optical distance, the following problems are caused.

First, the organic layer is formed of a transparent resin. When the transparent resin is applied with a thickness required to ensure the optical distance, there are problems in that the transparent resin is not evenly cured and specifically, the transparent resin in a lower portion which is in contact with the touch insulating layer is not cured.

The uncured organic layer has poor adhesiveness to cause adhesion defects such as interface exfoliation.

Further, a part of the uncured organic layer is etched by chemicals, such as an etchant used for development in a subsequent process for forming a touch electrode and thus, an undercut defect is caused. The larger the thickness of the organic layer, the more severe the defect.

Further, when the organic layer is not evenly cured, the physical property is different for every position and the surface characteristic is degraded to cause the stain in the subsequent process.

As described above, when the organic layer is provided in the touch sensor unit, a contact hole which exposes the top surface of the bridge electrode needs to be formed on the organic layer to electrically connect the bridge electrode and the touch electrode. However, when the organic layer is formed to be thicker than the touch insulating layer provided in the touch sensor unit, it is required to etch much deeper than the contact hole provided in the insulating layer of the touch sensor unit. Therefore, there is a problem in that the efficiency of the contact hole forming process is degraded.

As described above, the touch electrode is formed by the deposition process to cover a top surface of the bridge electrode, an end portion of the organic layer, and an upper edge of the organic layer which are exposed by the contact holes. However, the thicker the thickness of the organic layer, the larger the tapered angle of the end portion of the organic layer so that there is a problem in that the touch electrode is not deposited with a uniform thickness at the end portion of the organic layer. Moreover, there is a defect in that the touch electrode is disconnected in an area with a steep slope of the end portion of the organic layer. As described above, when the touch electrode is disconnected, the touch sensor unit erroneously operates so that a touch performance is degraded.

In order to solve these problems, in the display device according to the exemplary embodiment of the present disclosure, the organic layer 220 includes a first layer 222 and a second layer 224 and an end portion of the organic layer 220 is formed to have a double-stepped structure.

Hereinafter, each of the first layer 222 and the second layer 224 of the organic layer 220 and a double-stepped structure of the end portion of the organic layer 220 will be described in detail with reference to FIGS. 2 and 6.

Figure 6:
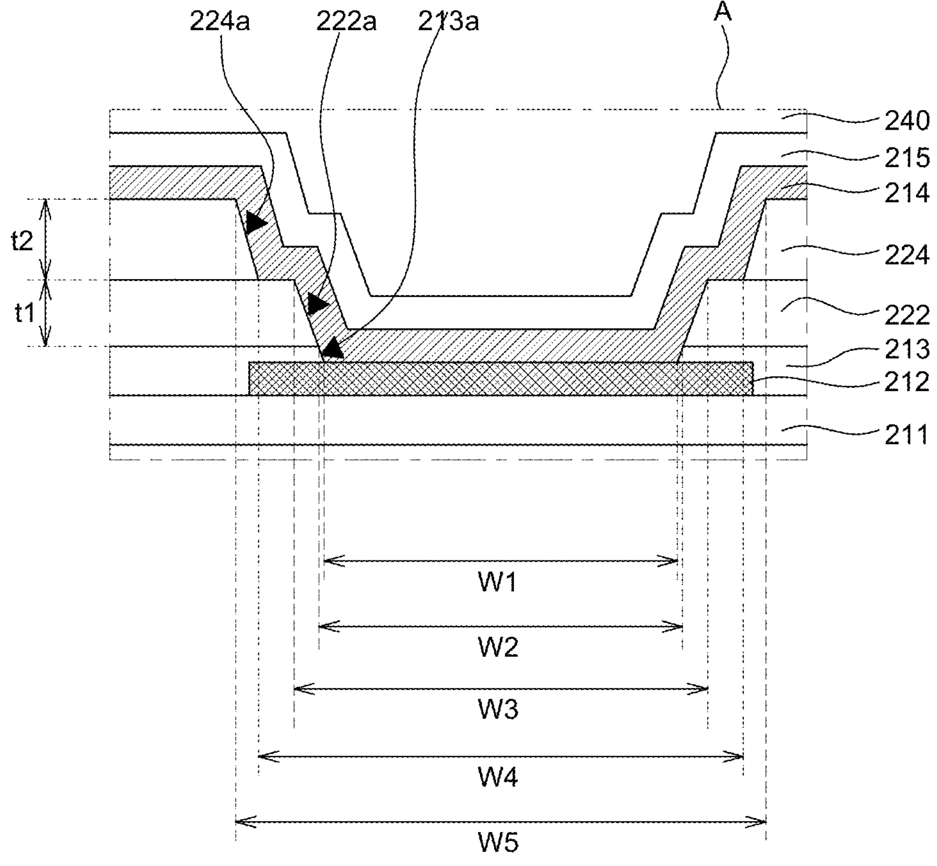
FIG. 6 is an enlarged view of an area A of FIG. 2 according to an exemplary embodiment of the present disclosure.
Figure 7A:
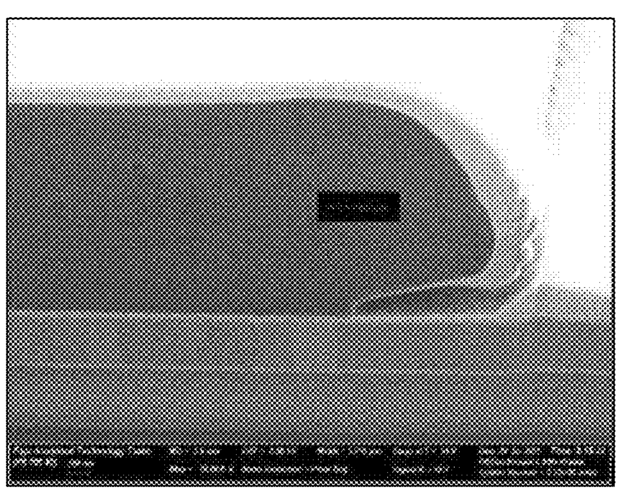
FIGS. 7A to 7E are photographs showing whether there is an undercut defect of a specimen according to Experimental Embodiments 3-1 to 3-5 according to an exemplary embodiment of the present disclosure.
Figure 7B:
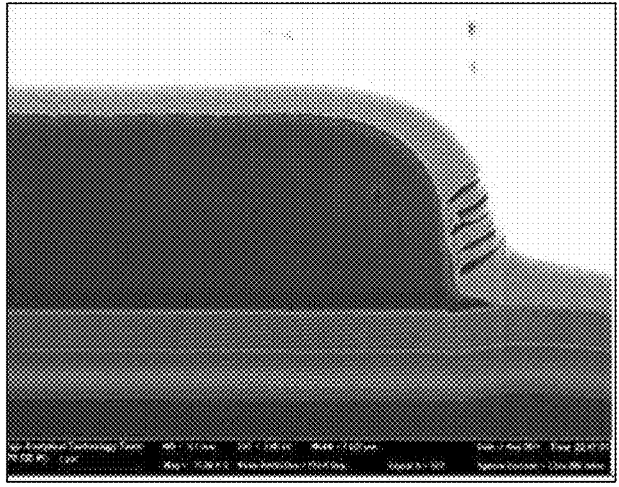
Figure 7C:
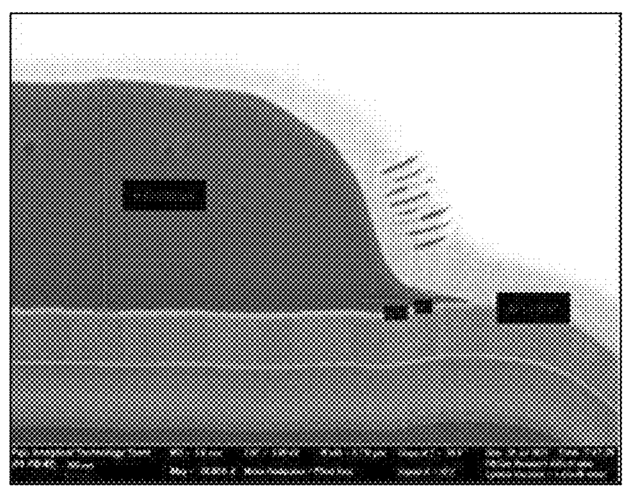
Figure 7D:
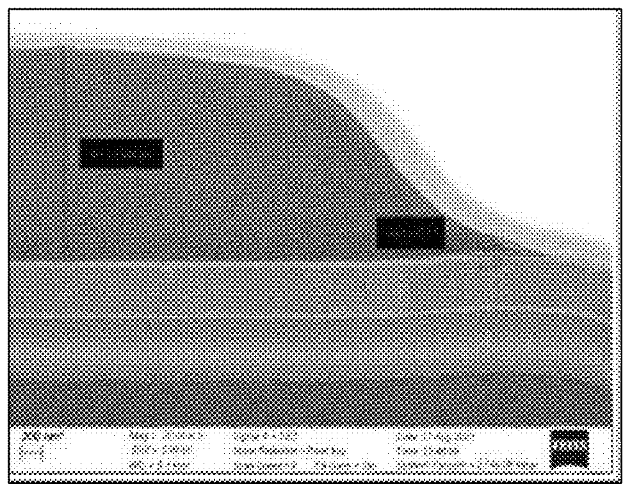
Figure 7E:
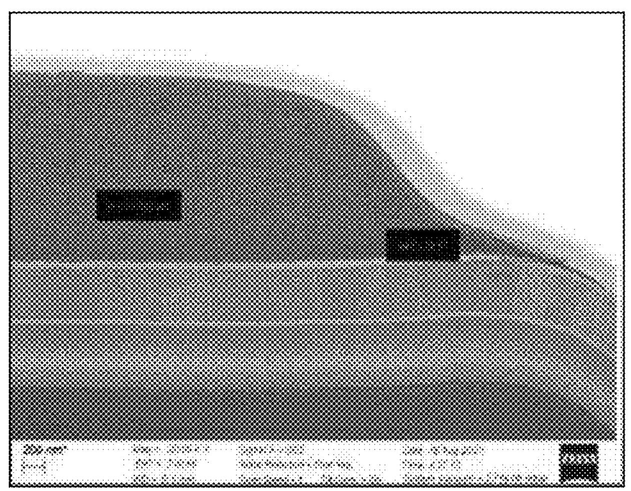

FIG. 6 is an enlarged view of an area A of FIG. 2 according to one embodiment.

First, the first layer 222 of the organic layer 220 includes transparent resin and nano particles.

As described above, in order to ensure the optical gap, when the transparent resin is thickly applied to perform the hardening process, there is a problem in that the transparent resin is not evenly cured and specifically, a transparent resin in a deep (e.g., thick) portion is not cured. As described above, an uncured deep portion of the organic layer has poor adhesiveness to cause various defects, such as an adhesion defect, an undercut defect, and a surface stain defect.

Accordingly, in order to improve the adhesiveness of the transparent resin, nano particles are mixed. The nano particles are present to be dispersed in the transparent resin. As described above, the nano particles are dispersed in the transparent resin, the roughness of the surface is increased to enhance the interfacial adhesiveness. Accordingly, the adhesiveness between the organic layer 220 and the touch insulating layer 213 is increased to solve the defect such as the interfacial exfoliation, the undercut defect, and the surface stain.

For example, a range of 10 to 40 parts by weight of the nano particles may be included based on 100 parts by weight of a transparent resin. In one embodiment, a range of 15 to 35 parts by weight of the nano particles may be included based on 100 parts by weight of the transparent resin. When the content of the nano particles is less than 10 parts by weight, the surface roughness is not greatly increased so that the improvement of the adhesiveness is insufficient. Further, the content of the nano particles exceeds 35 parts by weight, the adhesiveness between the first layer 222 and the touch insulating layer 213 is enhanced to cause a tail at an end portion of the first layer 222. When the exposed area of the bridge electrode 212 is reduced due to this tail, a contact area of the bridge electrode 212 and the touch electrode 214 is also reduced.

For example, the transparent resin may be one or more selected from the group consisting of acrylic resins, siloxane-based resins, polyimide-based resins, polyamide-based resins, cycloolefin-based resins, and fluorine-based resins. In one embodiment, the transparent resin may be acrylic resins or siloxane-based resins which have excellent optical properties and are easy to obtain. A structural compound such as a norbornene group or adamantly may optionally be bonded to the above-described transparent resin as needed.

For example, the nano particles may be selected from fullerene and silica nano particles. Such a diameter of fullerene and nano particles are few tens of nm (e.g., 0.1 to 100 nm) and enhances the interfacial adhesiveness by increasing the surface roughness of the organic layer 220 without degrading the optical property. The nano particles may have spherical, oval, and cylindrical shapes.

The second layer 224 includes a transparent resin, a multifunctional crosslinking agent, and a molecular sieve.

For example, the transparent resin may be one or more selected from the group consisting of acrylic resins, siloxane-based resins, polyimide-based resins, polyamide-based resins, cycloolefin-based resins, and fluorine-based resins. Desirably, the transparent resin may use acrylic resins or siloxane-based resins which have excellent optical properties and are easy to obtain or fluorine resins having a low permittivity. A structural compound such as a norbornene group or adamantly may optionally be bonded to the above-described transparent resin as needed.

After forming the second layer 224, the touch electrode 214 is formed by the deposition process. Unlike the organic layer 220 having a transparent resin as a main component, the touch electrode 214 is formed of metal. The transparent resin has several times higher coefficient of thermal expansion (CTE) compared to that of metal. Due to the difference in the coefficient of thermal expansion, during the process of forming the touch electrode 214 on the second layer 224, the deposition of the touch electrode 214 is not easy and the deposition defect may occur. When the difference in the coefficient of thermal expansion between different materials is large, during the high temperature process, the difference in stress applied to the materials is also large so that defects such as warpage or exfoliation may occur.

Therefore, in order to match the coefficient of thermal expansion of the organic layer 220 with the metal, a multifunctional crosslinking agent is included in the second layer 224. When the multifunctional crosslinking agent is mixed to the transparent resin, during the curing process, the transparent resin is crosslinked to lower the coefficient of thermal expansion. By doing this, the difference in the coefficient of thermal expansion between the organic layer 220 and the touch electrode 214 is reduced to easily deposit the touch electrode 214 and reduce the deposition defect.

As the multifunctional crosslinking agent, an acrylate-based compound may be used. For example, an acrylate-based compound having 3 to 9 functional groups may be used as the multifunctional crosslinking agent and desirably, an acrylate ester having 6 to 9 functional groups may be used. Further, two or more kinds of multifunctional crosslinking agents having different numbers of functional groups may be used together.

When a multifunctional crosslinking agent having 6 to 9 functional groups is introduced, a crosslinking density of the second layer 224 further increases. Therefore, the difference in coefficient of thermal expansion from the touch electrode 214 may be further reduced.

As described above, the organic layer 220 may improve the efficiency of the lenses 232 and 234 by ensuring an optical gap between the first light emitting diode De1 and the second light emitting diode De2 and the lenses 232 and 234 of the lens layer 230. However, the thickness of the touch sensor unit TS is increased to degrade the touch sensitivity.

In order to compensate for the degraded touch sensitivity, the molecular sieve is included in the second layer 224. The molecular sieve lowers the permittivity of the second layer 224 to reduce the parasitic capacitance. Accordingly, even though the display device according to the exemplary embodiment of the present disclosure includes the thick organic layer 220 in the touch sensor unit TS, excellent touch sensitivity may still be achieved.

For example, the molecular sieve may be mesoporous silica. Specifically, for example, as the molecular sieve, mesoporous silica such as SBA-15 may be used, but is not limited thereto.

For example, the molecular sieve may be included in an amount of 5 parts by weight or more, a range of 10 to 30 parts by weight in one embodiment, based on 100 parts by weight of the transparent resin. Within this range, the permittivity is reduced while maintaining high optical property of the organic layer 220 to significantly improve the touch sensitivity.

For example, the permittivity of the second layer 224 is 3.6 or lower, and, in a range of 2.8 to 3.6 in one embodiment. Within this range, the effect of the touch sensitivity improvement is excellent.

Hereinafter, the double-stepped structure of the organic layer 220 will be described in detail.

As described above, the organic layer 220 includes the first layer 222 and the second layer 224. Further, the touch insulating layer 213 includes a contact hole 213*a* to expose top surfaces of the plurality of bridge electrodes 212. Due to the characteristic of the etching process, the width of the contact hole 213*a* increases from a lower portion to an upper portion. Accordingly, the lower portion of the contact hole 213*a* has a first width W1 and the upper portion of the contact hole 213*a* has a second width W2 that is wider than the first width W1.

For example, the first width W1 may be 2 μm to 20 μm. In one embodiment, the first width W1 may be 2 μm to 15 μm. Within this range, the contact area between the bridge electrode 212 and the touch electrode 214 is sufficiently ensured so that the aperture ratio of the display device may be maintained high with the excellent touch characteristic.

The first layer 222 includes a first contact hole 222*a* which exposes a top surface of each of the plurality of bridge electrodes 212. The first contact hole 222*a* is formed in a position overlapping the contact hole 213*a* of the touch insulating layer 213. The contact hole 213*a* of the touch insulating layer 213 completely overlaps the first contact hole 222*a* of the first layer 222. Therefore, an end portion of the first layer 222 is located on the top surface (e.g., an upper surface) of the touch insulating layer 213.

The contact hole 213*a* of the touch insulating layer 213 and the first contact hole 222*a* of the first layer 222 may be formed by the same process. Accordingly, an end portion of the top surface of the touch insulating layer 213 matches (e.g., aligned with) an end portion of a bottom surface of the first layer 222. A lower portion of the first contact hole 222*a* completely overlaps an upper portion of the contact hole 213*a* of the touch insulating layer 213. However, it is not limited thereto and the contact hole 213*a* of the touch insulating layer 213 and the first contact hole 222*a* of the first layer 222 may be formed by different processes as needed. Therefore, a lower width of the first contact hole 222*a* of the first layer 222 may be wider than an upper width of the contact hole 213*a* of the touch insulating layer 213.

A width of the first contact hole 222*a* increases from the lower portion to the upper portion of the first contact hole 222*a*. A lower portion of the first contact hole 222*a* has a second width W2 and an upper portion of the first contact hole 222*a* has a third width W3 which is wider than the second width W2. Thus, the first contact hole 222*a* tapers from third width W3 at an upper surface of the first layer 222 to the second width W2 at a lower surface of the first layer 222.

The second layer 224 includes a second contact hole 224*a* which exposes a top surface of each of the plurality of bridge electrodes 212. A width of the second contact hole 224*a* increases from the lower portion to the upper portion of the second contact hole 224*a*. The second contact hole 224*a* is formed in a position overlapping the contact hole 213*a* of the touch insulating layer 213 and the first contact hole 224*a* of the first layer 224. The first contact hole 222*a* completely overlaps the second contact hole 224*a* of the second layer 224. A size of the second contact hole 224*a* is formed to be wider than the first contact hole 222*a* of the first layer 222. Therefore, the end portion of the second layer 224 is located on the top surface of the first layer 222. Further, the second contact hole 224*a* of the second layer 224 exposes at least a part of the top surface of the first layer 222 adjacent to the first contact hole 222*a*. That is, an end of the second layer 224 is inset from an end of the first layer 222 such the end of the first layer 222 extends beyond the end of the second layer 224. Due to the inset, the side surface of the organic layer 220 has a step between the ends of the first layer 222 and the second layer 224. As a result, the touch electrode 214 in in contact with the end of the first layer 222, the end of the second layer 224, and a portion of the upper surface of the first layer 222 that extends beyond the end of the second layer 224.

The lower portion of the second contact hole 224*a* has a fourth width W4 that is wider than the third width W3 and the upper portion of the second contact hole 224*a* has a fifth width (W5) that is wider than the fourth width W4. Thus, the second contact hole 224*a* tapers from fifth width W5 at an upper surface of the second layer 224 to the fourth width W4 at a lower surface of the second layer 224.

For example, the fifth width W5 is wider than the fourth width W4 and may be 50 μm or less in width. In one embodiment, the fifth width W5 is 35 μm or less. When the fifth width W5 exceeds 50 μm, in the active area with a limited area, an area occupied by the contact holes 231*a*, 222*a*, and 224*a* is increased to lower the aperture ratio.

As described above, the organic layer 220 is formed with a predetermined thickness or larger to ensure the optical gap. For example, the organic layer 220 may be formed with a thickness of 2 μm to 20 μm. In this case, a sufficient optical gap is ensured between the first light emitting diode De1 and the second light emitting diode De2 and the lens layer 230 to improve the efficiency. In one embodiment, the organic layer 220 may be formed with 6 μm to 14 μm and within this range, the efficiency of the lenses 232 and 234 is more excellent.

Each of the thickness t1 of the first layer 222 and a thickness t2 of the second layer 224 may be formed with a ratio of 10% to 90% of the thickness (t1+t2) of the organic layer 220.

In one embodiment, the thickness t1 of the first layer 222 may be formed with a ratio of 40% to 75% of the thickness of the organic layer 220. Thus, the thickness t1 of the first layer 222 is less than the thickness t2 of the second layer 224. Within this range, the adhesiveness with the lower layer is sufficiently improved to reduce the adhesion defect. For example, when the thickness of the organic layer 220 is 6 μm, the thickness t1 of the first layer 222 may be in a range of 2.4 μm to 4.5 μm.

In one embodiment, the thickness t2 of the second layer 224 may be formed with a ratio in a range of 25% to 60% of the thickness of the organic layer 220. Within this range, the permittivity of the organic layer 220 is sufficiently reduced and the coefficient of thermal expansion is lowered to easily deposit the touch electrode 214. For example, when the thickness of the organic layer 220 is 6 μm, the thickness t2 of the second layer 224 may be 1.5 μm to 3.6 μm.

As described above, the larger the thickness of the organic layer, the larger the tapered angle of the end portion of the organic layer, so that there are problems in that the touch electrode is not deposited at the end portion of the organic layer with a uniform thickness and the touch electrode is disconnected.

In the display device according to the exemplary embodiment of the present disclosure, the organic layer 220 includes a first layer 222 and a second layer 224 and the end portion thereof has a double-stepped structure to solve the above-described problems. Specifically, in the display device according to the exemplary embodiment of the present disclosure, the organic layer 220 includes the first layer 222 including the first contact hole 222*a* and the second layer 224 including the second contact hole 224*a* and the second contact hole 224*a* is larger than the first contact hole 222*a*. Therefore, the end portion of the organic layer has a double-stepped structure. Accordingly, as compared with the single organic layer with the same thickness as the organic layer 220 of the present disclosure, a slope of the end portion of the organic layer 220 is reduced. Accordingly, the touch electrode 214 may be formed with a uniform thickness by the deposition process and the disconnection defect of the touch electrode 214 is suppressed and the excellent touch characteristic is provided.

Further, the first contact hole 222*a* is formed in the first layer 222 and the second contact hole 224*a* is formed in the second layer 224 to easily form the contact hole in the organic layer 220 with a large thickness.

The present disclosure provides a display device in which the organic layer 220 is disposed in the touch sensor unit TS and the lens layer 230 is disposed on the touch sensor unit TS to control the viewing angle.

Further, the organic layer 220 of the present disclosure includes the first layer 222 and the second layer 224 and the first layer 222 includes nano particles such as fullerene to improve the interfacial adhesiveness, thereby solving the problems such as the adhesion defect, the undercut defect, and the surface stain defect. Further, the second layer 224 includes a molecular sieve to have a low permittivity characteristic and reduce the parasitic capacitance so that even though the organic layer 220 with a large thickness is applied, the touch sensitivity is excellent.

Further, the second layer 224 includes a multifunctional crosslinking agent, which lowers the coefficient of thermal expansion of the organic layer 220 to reduce the difference in the coefficient of thermal expansion of the organic layer 220 formed of an organic material and the touch electrode 214 formed of a metal, to make the deposition process of the touch electrode 214 easy.

According to the present disclosure, a double-stepped structure is applied to an end portion of the organic layer 220 to make a slope of the end portion of the organic layer 220 gentle, thereby solving the problem of poor deposition, such as a disconnection of a touch electrode.

Accordingly, the display device according to the exemplary embodiment of the present disclosure provides excellent viewing angle control characteristic, touch characteristic, and luminance.

Hereinafter, the effects of the present disclosure will be described in more detail with reference to Exemplary Embodiments. However, the following Exemplary Embodiments are set forth to illustrate the present disclosure, but the scope of the disclosure is not limited thereto.

Experimental Embodiment 1

The change in permittivity of the organic layer according to a content of molecular sieve (SBA-15) dispersed in a transparent resin and the resulting touch sensitivity were measured. The results were represented in the following Table 1.

TABLE 1

| | Experimental Em. 1-1 | Experimental Em. 1-2 | Experimental Em. 1-3 | Experimental Em. 1-4 | Experimental Em. 1-5 |
|---|---|---|---|---|---|
| Content of molecular sieve* | 0 part by weight | 5 parts by weight | 10 parts by weight | 15 parts by weight | 20 parts by weight |
| Permittivity | 3.54 | 3.27 | 3.03 | 2.86 | 2.79 |
| Touch sensitivity | 37.1 dB | 39.4 dB | 41.0 dB | 43.0 dB | 44.4 dB |

In Table 1, a content of the molecular sieve is based on 100 parts by weight of a transparent resin.

As seen from Table 1, it was confirmed that the more the content of the molecular sieve dispersed in the transparent resin, the smaller the permittivity of the organic layer, and thus the higher the touch sensitivity. By doing this, it was confirmed that the permittivity of the organic layer was lowered by mixing molecular sieve into the transparent resin and the parasitic capacitance was reduced to improve the touch performance.

Experimental Embodiment 2

A change in a coefficient of thermal expansion of the organic layer according to a type and a content of a multifunctional crosslinking agent dispersed in the transparent resin was measured and after forming the metal electrode layer on the organic layer, stresses of the organic layer and the metal electrode layer were measured, respectively. The result was represented in the following Table 2.

TABLE 2

| | Experimental Em. 2-1 | Experimental Em. 2-2 | Experimental Em. 2-3 | Experimental Em. 2-4 | Experimental Em. 2-5 |
|---|---|---|---|---|---|
| Trifunctional crosslinking agent | 80 parts by weight | 60 parts by weight | 40 parts by weight | 20 parts by weight | 0 part by weight |
| Hexafunctional crosslinking agent | 60 parts by weight | 80 parts by weight | 60 parts by weight | 80 parts by weight | 80 parts by weight |
| 9-functional crosslinking agent | 0 part by weight | 0 part by weight | 20 parts by weight | 20 parts by weight | 40 parts by weight |
| Coefficient of thermal expansion | 83 ppm/° C. | 70 ppm/° C. | 57 ppm/° C. | 42 ppm/° C. | 24 ppm/° C. |

TABLE 2-continued

| | Experimental Em. 2-1 | Experimental Em. 2-2 | Experimental Em. 2-3 | Experimental Em. 2-4 | Experimental Em. 2-5 |
|---|---|---|---|---|---|
| Stress of organic layer | 0.412% | 0.322% | 0.232% | 0.128% | −0.003% |
| Stress of electrode layer | −0.034% | −0.026% | −0.019% | −0.010% | 0.000% |
| Difference in stress | −0.446% | −0.348% | −0.251% | −0.138% | −0.003% |

Referring to Table 2, in Experimental Embodiment 2-1 in which the trifunctional crosslinking agent and the hexafunctional crosslinking agent were mixed and a ratio of trifunctional crosslinking agent was relatively high, it was confirmed that the coefficient of thermal expansion of the organic layer was largest. Accordingly, it was confirmed that the difference in stresses of the organic layer and the metal electrode layer were large. Unlike Experimental Embodiment 2-1, in Experimental Embodiment 2-2 in which the hexafunctional crosslinking agent was relatively high, it was confirmed that the coefficient of thermal expansion of the organic layer was lower than that of Experimental Embodiment 2-1 so that the difference in stress was correspondingly reduced.

In the case of Experimental Embodiments 2-3 to 2-5 including 9-functional crosslinking agent, the coefficient of thermal expansion was much lower than those of Experimental Embodiments 2-1 and 2-2 so that it was confirmed that the difference in stress was significantly reduced. Further, in the case of Experimental Embodiment 2-5 in which the hexafunctional crosslinking agent and the 9-functional crosslinking agent were mixed without including the trifunctional crosslinking agent, the coefficient of thermal expansion was the lowest. Accordingly, it was confirmed that the difference in stress between the organic layer and the metal electrode layer was also the smallest.

By doing this, it was understood that when a multifunctional crosslinking agent, specifically, a multifunctional crosslinking agent having 6 to 9 functional groups was applied to the transparent resin, the coefficient of thermal expansion of the organic layer was lowered to easily form the touch electrode on the organic layer. Accordingly, the surface stain defect may be improved.

Experimental Embodiment 3

An adhesive characteristic of an organic layer was evaluated according to a content of fullerene dispersed in the transparent resin. Specifically, the insulating layer was formed on a base material, and an organic layer was formed by dispersing fullerene into the transparent resin with the content as described in following Table 3, and then a metal electrode layer was formed. It was identified whether the specimen prepared in this way had an undercut defect by means of the scanning electron microscopy analysis. The results were represented in the following Table 3 and FIGS. 7A to 7E.

FIGS. 7A to 7E are photographs showing whether there is an undercut defect of a specimen according to Experimental Embodiments 3-1 to 3-5;

In the following Table 3, it was evaluated that when the undercut defect was observed, the undercut defect was evaluated as X. Even though the undercut defect was not observed, when other problems such as a large tapered angle of the end portion or increased tails were observed, the undercut defect was evaluated as Δ. Further, when other defect elements as well as the undercut defect were not discovered, it was evaluated as O.

TABLE 3

| | Experimental Em. 3-1 | Experimental Em. 3-2 | Experimental Em. 3-3 | Experimental Em. 3-4 | Experimental Em. 3-5 |
|---|---|---|---|---|---|
| Fullerene content* | 0 Part by weight | 10 Parts by weight | 20 Parts by weight | 30 Parts by weight | 40 Parts by weight |
| Whether there is undercut defect | X | Δ | ○ | ○ | Δ |

In Table 3, a content of the fullerene is based on 100 parts by weight of a transparent resin.

Referring to Table 3 and FIGS. 7A to 7E together, in Experimental Embodiment 3-1 in which fullerene was not added, the undercut defect occurred. In Experimental Embodiments 3-2 to 3-5 in which the fullerene was added by 10 parts by weight to 40 parts by weight, the undercut defect did not occur. It was confirmed that when the content of fullerene was 10 parts by weight, the tapered angle of the end portion of the organic layer was formed to be large and when the content of fullerene was 40 parts by weight, a tail of the end portion of the organic layer was increased as the adhesiveness was enhanced. Therefore, it was more desirable to add the fullerene within 15 parts by weight to 35 parts by weight.

In summary of the experiment results, it was understood that when the nano particles such as fullerene was mixed in the transparent resin, the curability of the deep portion was enhanced to improve the adhesiveness so that the defect problem due to the lowering of the adhesiveness, such as undercut was solved.

Experimental Embodiment 4

1) Comparative Embodiment 4-1

A display device which was capable of controlling a viewing angle was produced by laminating a light control film for controlling a viewing angle and a touch sensor unit on a display panel.

2) Comparative Embodiment 4-2

A display device which was capable of controlling a viewing angle was produced by disposing a touch sensor unit on a display panel, separately disposing an organic layer on the touch sensor unit, and disposing a lens layer on the organic layer.

3) Exemplary Embodiment 4-1

As illustrated in FIG. 2, a display device which was capable of controlling a viewing angle was produced by disposing a touch sensor unit with an embedded organic layer on the display panel and laminating the lens layer on the touch sensor unit.

A relative luminance for every viewing angle was measured for the respective display devices of Comparative Embodiments 4-1 and 4-2 and Exemplary Embodiment 4-1. The results were represented in the following Table 4 and FIGS. 8A to 8C.

Figure 8A:
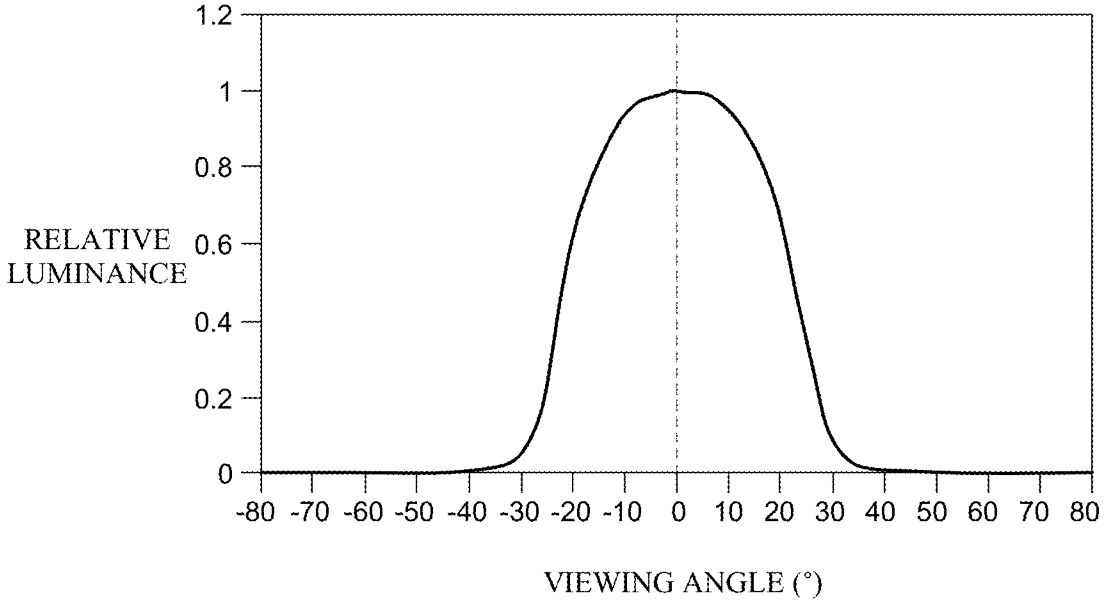
FIGS. 8A to 8C are graphs illustrating a relative luminance for every viewing angle of a display device according to Experimental Embodiments 4-1 to 4-3 according to an exemplary embodiment of the present disclosure.
Figure 8B:
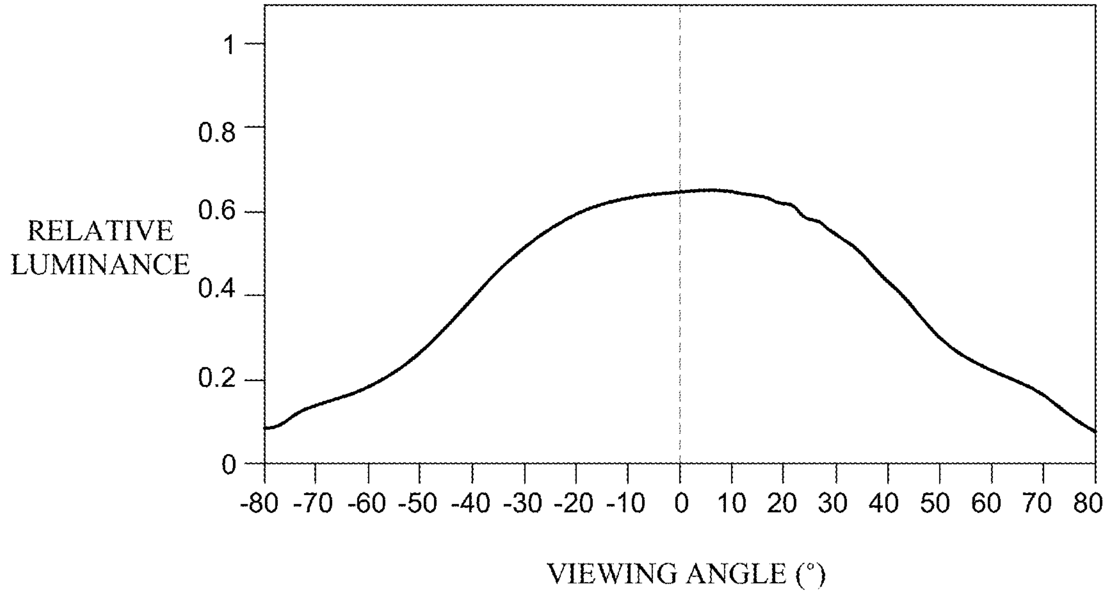
Figure 8C:
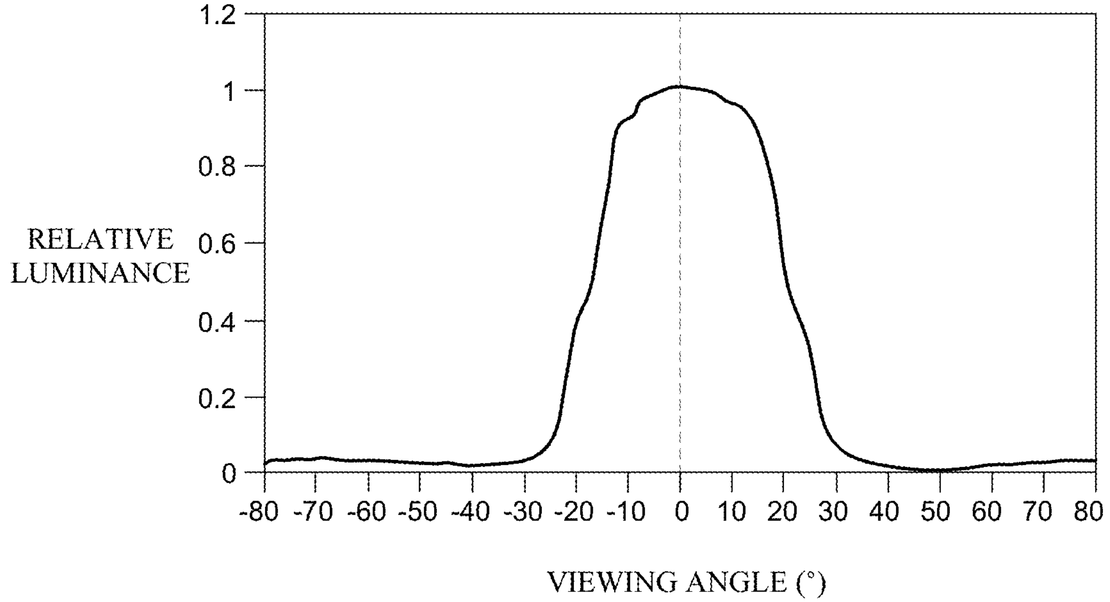

FIG. 8A is a graph illustrating a relative luminance for every viewing angle of a display device of Comparative Embodiment 4-1. FIG. 8B is a graph illustrating a relative luminance for every viewing angle of a display device of Comparative Embodiment 4-2. FIG. 8C is a graph illustrating a relative luminance for every viewing angle of a display device of Experimental Embodiment 4-1.

TABLE 4

| Classification | | Comp. Em. 4-1 | Comp. Em. 4-2 | Experimental Em. 4-1 |
|---|---|---|---|---|
| Luminance | Front | 100% | 65% | 100% |
| | 30 degrees in vertical direction | 9% | 55% | 7% |

Referring to Table 4 and FIGS. 8A to 8C together, it was confirmed that the display device of Comparative Embodiment 4-1 provided a narrow viewing angle with a relative luminance of 9% at 30 degrees in the vertical direction.

Further, the display device of Comparative Embodiment 4-2 had a front luminance inferior to Comparative Embodiment 4-1 in which a light control film was separately laminated on the display panel and the relative luminance was not significantly different from the front luminance at 30 degrees in the vertical direction. Therefore, it was confirmed that the effect of controlling the viewing angle was insignificant.

In the meantime, it was confirmed that the display device of Exemplary Embodiment 4-1 provided a narrow viewing angle with a luminance of 7% at 30 degrees in the vertical direction while having an excellent front luminance.

Accordingly, it was confirmed that the display device with a configuration according to the present disclosure had a viewing angle control function superior to the display device of Comparative Embodiments 4-1 and 4-2 with a structure of the related art.

Experimental Embodiment 5

1) Exemplary Embodiment 5-1

As illustrated in FIG. 2, a display device including an organic layer (thickness of 6 μm) configured by a first layer including a transparent resin and fullerene and a second layer including a transparent resin, a multifunctional cross-linking agent, and a molecular sieve was produced.

2) Comparative Embodiment 5-1

The display device was produced in the same manner as Exemplary Embodiment 5-1 except that the organic layer was formed as a single layer formed of a transparent resin with a thickness of 6 μm, instead of the organic layer configured by the first layer and the second layer.

Figure 9A:
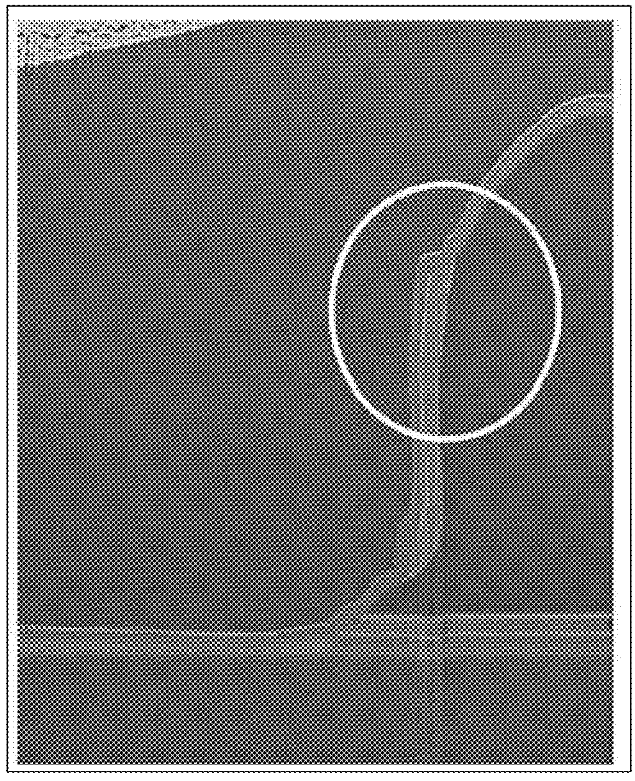
FIGS. 9A and 9B are scanning electron micrographs of an end portion of an organic layer in a display device according to Exemplary Embodiment 5-1 and Comparative Embodiment 5-1 according to an exemplary embodiment of the present disclosure.
Figure 9B:
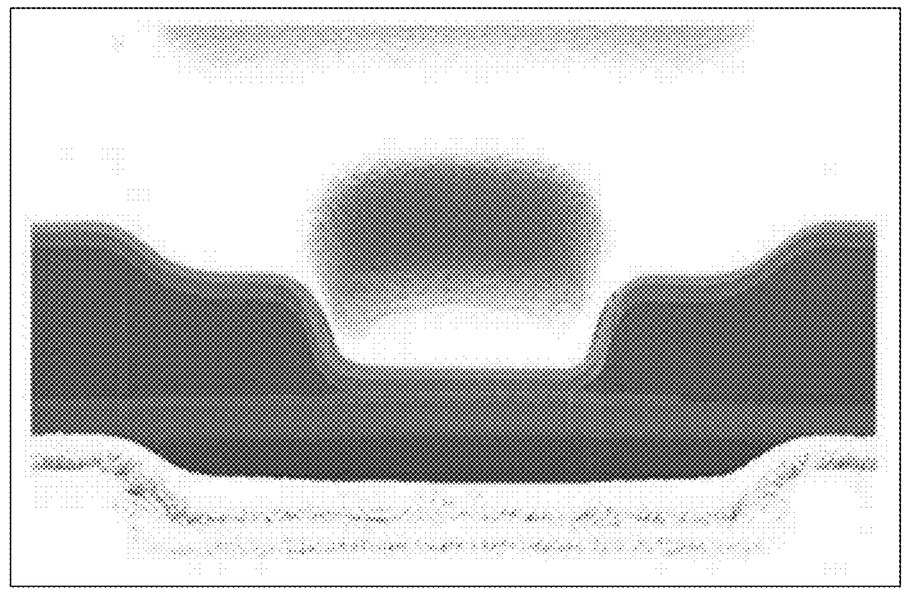

In the display device according to each of Exemplary Embodiment 5-1 and Comparative Embodiment 5-1, the scanning electron microscopy analysis was performed to confirm that the touch electrode was normally deposited at the end portion of the organic layer. A result thereof was illustrated in FIGS. 9A and 9B. FIG. 9A is a scanning electron micrograph of an end portion of an organic layer in a display device according to Exemplary Embodiment 5-1. FIG. 9B is a scanning electron micrograph of an end portion of an organic layer in a display device according to Comparative Embodiment 5-1.

Referring to FIGS. 9A and 9B, it was confirmed that in Exemplary Embodiment 5-1 including an organic layer including a first layer and a second layer, the touch electrode was deposited with a uniform thickness without having a disconnection. In contrast, in Comparative Embodiment 5-1 in which a single organic layer was formed, it was confirmed that even though the thickness of the organic layer was equal to that of Exemplary Embodiment 5-1, a tapered angle of the end portion of the organic layer was large so that the touch electrode was disconnected.

The exemplary embodiments of the present disclosure can also be described as follows:

According to an aspect of the present disclosure, a display device comprises a substrate, a plurality of light emitting diodes disposed on the substrate, an encapsulation layer disposed so as to cover the plurality of light emitting diodes, a touch sensor unit disposed on the encapsulation layer, and a lens layer disposed on the touch sensor unit, wherein the touch sensor unit includes, a plurality of bridge electrodes disposed on the encapsulation layer, an organic layer which is disposed on the bridge electrodes so as to expose at least a part of each of the plurality of bridge electrodes, and a touch electrode disposed to be in contact with each of the plurality of exposed bridge electrodes, and the organic layer includes a first layer including a plurality of first contact holes which exposes at least a part of each of the plurality of bridge electrodes, and a second layer which is disposed on the first layer and includes a plurality of second contact holes overlapping the plurality of first contact holes, respectively.

The first contact hole may fully overlap the second contact hole.

An end portion of the first layer may be disposed so as to cover an edge of each of the plurality of bridge electrodes and an end portion of the second layer does not match the end portion of the first layer and may be located on a top surface of the first layer.

The first contact hole may expose a top surface of each of the plurality of bridge electrodes and the second contact hole may expose the top surface of each of the plurality of bridge electrodes and at least a part of a top surface of the first layer may adjacent to the first contact hole.

An upper width of the first contact hole may be larger than a lower width of the first contact hole, the upper width of the first contact hole may fully overlap a lower width of the second contact hole, the lower width of the second contact hole may be larger than the upper width of the first contact hole, and an upper width of the second contact hole may be larger than the lower width of the second contact hole.

A thickness of the organic layer may be 2 μm to 20 μm, a thickness of the first layer may be 10% to 90% of a total thickness of the organic layer, and a thickness of the second layer may be 10% to 90% of a total thickness of the organic layer.

The first layer may include a transparent resin and nano particles dispersed in the transparent resin and the second layer may include a transparent resin, a multifunctional crosslinking agent, and a molecular sieve.

The transparent resin of the first layer and the transparent resin of the second layer may be independently one or more selected from the group consisting of acrylic resins, siloxane-based resins, polyimide-based resins, polyamide-based resins, cycloolefin-based resins, and fluorine-based resins.

The nano particles may be one or more selected from fullerene and silica nano particles.

The molecular sieve may be a mesoporous silica and the multifunctional crosslinking agent may be an acrylate-based compound having 3 to 9 functional groups.

A permittivity of the second layer may be 2.8 to 3.6.

A plurality of sub pixels may be defined on the substrate, each of the plurality of sub pixels may include a first light emitting diode and a second light emitting diode disposed on the substrate, and the lens layer may include a first lens which corresponds to the first light emitting diode and refracts light from the first light emitting diode and a second lens which corresponds to the second light emitting diode and refracts light from the second light emitting diode.

The display device may further comprises a bank disposed on the substrate, correspondingly between adjacent the sub pixels and between the first light emitting diode and the second light emitting diode, wherein the plurality of bridge electrodes and the touch electrode may be disposed so as to correspond to the bank, and the first lens may be disposed so as to overlap the first light emitting diode, and the second lens may be disposed so as to overlap the second light emitting diode.

The first lens may be a half-spherical lens and the second lens may be a half-cylindrical lens.

Each of the plurality of sub pixels may be selectively driven in a first mode and a second mode, in the first mode, the first light emitting diode emits light so that light from the first light emitting diode is output by the first lens with a limited viewing angle only in a first direction, and in the second mode, the second light emitting diode emits light so that light from the second light emitting diode is output by the second lens with a limited viewing angle in the first direction and a second direction.

In each of the first mode and the second mode, the first light emitting diode and the second light emitting diode may be differently driven.

What is claimed is:

1. A display device, comprising:
a substrate;
an interlayer insulating layer covering a gate electrode of a thin film transistor on the substrate;
a passivation layer covering the thin film transistor;
a plurality of light emitting diodes on the passivation layer;
an encapsulation layer on the plurality of light emitting diodes;
a touch sensor unit on the encapsulation layer; and
a lens layer on the touch sensor unit,
wherein the touch sensor unit includes:
a plurality of bridge electrodes on the encapsulation layer;
an organic layer on the plurality of bridge electrodes, at least a part of each of the plurality of bridge electrodes exposed through the organic layer; and
a touch electrode in contact with each of the plurality of exposed bridge electrodes, and
the organic layer includes:
a first layer including a plurality of first contact holes that expose at least a part of each of the plurality of bridge electrodes and
a second layer on the first layer, the second layer including a plurality of second contact holes that each overlap a corresponding one of the plurality of first contact holes,
wherein the plurality of light emitting diodes include a first light emitting diode and a second light emitting diode,
wherein the lens layer includes:
a first lens that overlaps the first light emitting diode and refracts light from the first light emitting diode; and
a second lens that overlaps the second light emitting diode and refracts light from the second light emitting diode,
wherein the first lens and the second lens do not overlap with the plurality of bridge electrodes and touch electrodes,
wherein an end portion of the first layer covers an edge of each of the plurality of bridge electrodes, and a position of an end portion of the second layer is not equal with a position of the end portion of the first layer and is on a top surface of the first layer, and
wherein the touch electrode is in contact with a side surface of the first layer, a side surface of the second layer, and a portion of a top surface of the first layer extending past the end portion of the second layer.

2. The display device according to claim 1, wherein a first contact hole from the plurality of first contact holes fully overlaps a second contact hole from the plurality of second contact holes.

3. The display device according to claim 1, wherein each of the plurality of first contact holes exposes a top surface of a corresponding bridge electrode from the plurality of bridge electrodes, and each of the plurality of second contact holes exposes the top surface of the corresponding bridge electrode from the plurality of bridge electrodes and at least a part of a top surface of a portion of the first layer adjacent to the first contact hole.

4. The display device according to claim 2, wherein an upper width of the first contact hole is wider than a lower width of the first contact hole, the upper width of the first contact hole fully overlaps a lower width of the second contact hole, the lower width of the second contact hole is wider than the upper width of the first contact hole, and an upper width of the second contact hole is wider than the lower width of the second contact hole.

5. The display device according to claim 1, wherein a thickness of the organic layer is in a range of 2 μm to 20 μm, a thickness of the first layer is in a range of 10% to 90% of a total thickness of the organic layer, and a thickness of the second layer is in a range of 10% to 90% of the total thickness of the organic layer.

6. The display device according to claim 1, wherein the first layer includes a first transparent resin and nano particles dispersed in the first transparent resin, and the second layer includes a second transparent resin, a multifunctional cross-linking agent, and a molecular sieve, wherein the first transparent resin of the first layer and the second transparent resin of the second layer are independently one or more selected from a group consisting of acrylic resins, siloxane-based resins, polyimide-based resins, polyamide-based resins, cycloolefin-based resins, and fluorine-based resins, wherein the nano particles are one or more selected from fullerene particles or silica nano particles, and wherein the molecular sieve comprises mesoporous silica, and the multifunctional crosslinking agent comprises an acrylate-based compound having 3 to 9 functional groups.

7. The display device according to claim 1, wherein a plurality of sub pixels are defined on the substrate, each of the plurality of sub pixels including the first light emitting diode and the second light emitting diode on the substrate.

8. The display device according to claim 7, further comprising:

a bank on the substrate, the bank between adjacent sub pixels from the plurality of sub pixels and between the first light emitting diode and the second light emitting diode, wherein the plurality of bridge electrodes and the touch electrode overlap the bank.

9. The display device according to claim 7, wherein the first lens is a half-spherical lens and the second lens is a half-cylindrical lens.

10. The display device according to claim 7, wherein each of the plurality of sub pixels is selectively driven in a first mode and a second mode, in the first mode, the first light emitting diode emits light such that the light from the first light emitting diode is output by the first lens with a first limited viewing angle in a first direction but not a second direction, and in the second mode, the second light emitting diode emits light so that the light from the second light emitting diode is output by the second lens with a second limited viewing angle in the first direction and the second direction.

11. The display device according to claim 10, wherein in the first mode the second light emitting diode is driven and the first light emitting diode is not driven, and in the second mode the first light emitting diode is driven and the second light emitting diode is not driven.

12. A display device comprising:

a substrate;

an interlayer insulating layer covering a gate electrode of a thin film transistor on the substrate;

a passivation layer covering the thin film transistor;

a plurality of subpixels on the substrate, the plurality of subpixels configured to emit light;

an encapsulation layer on the plurality of subpixels;

a bridge electrode on the encapsulation layer;

an organic layer on the bridge electrode, the organic layer including a first layer on the bridge electrode, a second layer on the first layer and having an end that is inset from an end of the first layer such that the end of the first layer extends past the end of the second layer, and a hole through the first layer and the second layer;

a touch electrode that is in contact with the bridge electrode through the hole in the organic layer; and a lens layer on the organic layer, the lens layer including a plurality of lenses, wherein each of the plurality of subpixels including a first light emitting diode and a second light emitting diode, wherein the lens layer includes:

a first lens that overlaps the first light emitting diode and refracts light from the first light emitting diode; and a second lens that overlaps the second light emitting diode and refracts light from the second light emitting diode, and wherein the first lens and the second lens do not overlap with the bridge electrode and touch electrodes, and wherein the touch electrode is in contact with a side surface of the first layer, a side surface of the second layer, and a portion of a top surface of the first layer extending past the end portion of the second layer.

13. The display device of claim 12, wherein the hole comprises a first hole in the first layer and a second hole in the second layer that overlaps the first hole, the second hole wider than the first hole.

14. The display device of claim 13, wherein a width of the first hole in the first layer tapers from an upper surface of the first layer to a lower surface of the first layer that is closer to the substrate than the upper surface of the first layer, and a width of the second hole in the second layer tapers from an upper surface of the second layer to a lower surface of the second layer that is closer to the substrate than the upper surface of the second layer.

15. The display device of claim 12, wherein the first layer includes a first transparent resin and nano particles dispersed in the first transparent resin, and the second layer includes a second transparent resin, a multifunctional crosslinking agent, and a molecular sieve.

16. A display device comprising:

a substrate;

an interlayer insulating layer covering a gate electrode of a thin film transistor on the substrate;

a passivation layer covering the thin film transistor;

a subpixel on the substrate, the subpixel including a first light emitting element and a second light emitting element configured to emit light of a same color;

a lens layer including a first lens and a second lens, the first lens overlapping the first light emitting element and refracting light from the first light emitting element, and the second lens overlapping the second light emitting element and refracting light from the second light emitting element;

a bridge electrode that is non-overlapping with the subpixel;

an organic layer between the bridge electrode and the lens layer, the organic layer including a first layer on the bridge electrode, a second layer on the first layer and having an end that is inset from an end of the first layer such that the end of the first layer extends past the end of the second layer, and a hole through the first layer and the second layer such that a side surface of the organic layer includes a step portion, and a touch electrode that is in contact with the bridge electrode through the hole in the organic layer, wherein during a first mode of the display device the first light emitting element is turned on to emit light through the first lens and the second light emitting element is turned off such that that the display device has a first viewing angle, and during a second mode of the display device the second light emitting element is turned on to emit light through the second lens and the first light emitting element is turned off such that the display device has a second viewing angle that is different from the first viewing angle, wherein the first lens and the second lens do not overlap with the bridge electrode and touch electrodes, and wherein the touch electrode is in contact with a side surface of the first layer, a side surface of the second layer, and a portion of a top surface of the first layer extending past the end portion of the second layer.

17. The display device of claim 16, wherein the first lens has a first shape that is a half-spherical shape and the second lens has a second shape that is a half-cylindrical shape.

18. The display device of claim 16, wherein the organic layer comprises:

a first layer on the bridge electrode; and a second layer on the first layer and having an end that is inset from an end of the first layer to form the step portion.

* * * * *